(12) United States Patent
Kimura et al.

(10) Patent No.: US 6,452,213 B1
(45) Date of Patent: Sep. 17, 2002

(54) SEMICONDUCTOR DEVICE HAVING FIRST, SECOND AND THIRD NON-CRYSTALLINE FILMS SEQUENTIALLY FORMED ON INSULATING BASE WITH SECOND FILM HAVING THERMAL CONDUCTIVITY NOT LOWER THAN THAT OF FIRST FILM AND NOT HIGHER THAN THAT OF THIRD FILM, AND METHOD OF MANUFACTURING THE SAME

(75) Inventors: Yoshinobu Kimura, Tokyo; Makoto Ohkura, Fuchu; Takeo Shiba, Kodaira; Takahiro Kamo, Tokyo; Yoshiyuki Kaneko, Hachioji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/696,002

(22) Filed: Oct. 26, 2000

(30) Foreign Application Priority Data

Oct. 28, 1999 (JP) .............................. 11-307502

(51) Int. Cl.$^7$ ............................................. H01L 29/786
(52) U.S. Cl. ............................................. 257/66; 257/75
(58) Field of Search ............................. 257/66, 75

(56) References Cited

U.S. PATENT DOCUMENTS

| | | | | |
|---|---|---|---|---|
| 3,518,503 A | * | 6/1970 | Doo ............................. | 257/75 |
| 4,543,133 A | * | 9/1985 | Mukai ........................... | 257/75 |
| 5,486,237 A | * | 1/1996 | Sano ............................ | 257/75 |
| 5,696,388 A | * | 12/1997 | Funada ......................... | 257/75 |
| 5,763,904 A | * | 6/1998 | Nakajima ..................... | 257/66 |
| 5,771,110 A | * | 6/1998 | Hirano ......................... | 257/75 |

OTHER PUBLICATIONS

King et al, *IEEE Elec. Dev. Lett.* vol. 12 No. 11 "PMOS Transistors . . . Films" pp. 584–586, Nov. 1991.*
1996 Society for Information Display International Symposium Digest of Technical Papers, pp. 17–20.
IEEE Transactions on Electron Devices, vol. 43, No. 9, 1996, pp. 1454–1457.
Applied Physics Letters, vol. 63, No. 14, 1993, pp. 1969–1971.
Japanese Journal of Applied Physics, vol. 37, 1998, pp. 5474–5479.

* cited by examiner

*Primary Examiner*—Jerome Jackson
(74) *Attorney, Agent, or Firm*—Mattingly, Stanger & Malur, P.C.

(57) ABSTRACT

A first thin film is formed on one surface of an insulating base, and a second thin film having a thermal conductivity higher than the first thin film is formed on the first thin film. An amorphous semiconductor thin film having a higher thermal conductivity than the second thin film is formed on at least the second thin film. The amorphous semiconductor thin film is changed to a polycrystalline semiconductor thin film through laser annealing. The provision of the second thin film results in larger and uniform crystal grain diameters and less proturberances in the polycrystalline semiconductor thin film.

6 Claims, 20 Drawing Sheets

PRIOR ART

PRIOR ART

PRIOR ART

3 μm

FIG. 18ℓ

SEMICONDUCTOR DEVICE HAVING FIRST, SECOND AND THIRD NON-CRYSTALLINE FILMS SEQUENTIALLY FORMED ON INSULATING BASE WITH SECOND FILM HAVING THERMAL CONDUCTIVITY NOT LOWER THAN THAT OF FIRST FILM AND NOT HIGHER THAN THAT OF THIRD FILM, AND METHOD OF MANUFACTURING THE SAME

BACKGROUND OF THE INVENTION

The present invention relates to a semiconductor thin film substrate, a semiconductor device, a semiconductor device manufacturing method and an electronic apparatus, and more particularly, to the technology for manufacturing transistors (for example, a thin film transistor (TFT)) using polycrystalline films (polycrystalline semiconductor thin films), a semiconductor thin film substrate for manufacturing the thin film transistor, and the technology which is effectively applicable to manufacturing processes for electronic apparatus such as a liquid crystal display device, an information processing apparatus and so on that incorporate the thin film transistors.

Thin film transistors so far used in conventional image display devices and so on are formed using polycrystalline silicon which is fabricated on an insulating base made of glass, quartz or the like by a recrystallization method such as excimer laser anneal or the like, using amorphous silicon or micro-crystalline silicon formed by a plasma CVD method or the like as a precursor.

A conventional method of manufacturing a polycrystalline semiconductor thin film (polycrystalline silicon thin film) and a thin film transistor will be described below with reference to FIGS. 1a–1d, 2, 3, 4a–4c, and 5a–5c.

As illustrated in FIG. 1a, a silicon oxide film ($SiO_2$ film) 102 and an amorphous silicon thin film 103 are sequentially formed on an insulating base 101, for example, a glass base 101. Next, as illustrated in FIG. 1b, the surface of the amorphous silicon thin film 103 is irradiated with excimer laser light 105 which has light flux of rectangular or elongated cross-section. As indicated by an arrow 106, the laser light 105 is moved (scanned) to anneal the overall surface of the amorphous silicon thin film 103 with the excimer laser light 105. The amorphous silicon thin film 103 changes from an amorphous structure to a polycrystalline silicon thin film 104 by this annealing through a melt/solidification process, as illustrated in FIG. 1c.

The foregoing process is referred to as an excimer laser annealing process (excimer laser crystallization), and is used for fabricating a high quality polycrystalline thin film on a base made of a low melting point material such as glass. The excimer laser annealing process is described in detail, for example, in "1996 Society for Information Display International Symposium Digest of Technical Papers," pp. 17–20, and "IEEE Transactions on Electron Devices," vol. 43, no. 9, 1996, pp. 1454–1457, and so on.

FIG. 1d is a schematic diagram illustrating a TFT which has been formed using the aforementioned polycrystalline silicon thin film 104. In the polycrystalline silicon thin film 104, semiconductor regions 110, 111 are formed by diffusing a predetermined impurity element. These semiconductor regions 110, 111 constitute a source region and a drain region of a field effect transistor. Also, a gate insulating film 112 made of $SiO_2$ is provided on the surface of the polycrystalline silicon thin film 104 between the semiconductor regions 110, 111, and a gate electrode 113 is provided on the gate insulating film 112. In this structure, a source-to-drain current can be controlled by a voltage applied at the gate electrode 113. For example, the gate has a length of 4 μm and a width of 4 μm.

FIG. 2 is a graph related to the dependency of the silicon crystal grain diameter on an irradiated laser energy density in the conventional excimer laser crystallization. In this example, an amorphous silicon thin film 103 formed on an insulating base 101, for example, a glass base 101, has a thickness of 100 nm, and is crystallized by XeCl excimer laser-based annealing (at wavelength of 308 nm). As can be seen from the graph, the amorphous silicon thin film is not crystallized at a laser energy density below 100 $mJ/cm^2$ since the thin film is not melted with such energy. However, the thin film is melted from its surface as the energy density exceeds 100 $mJ/cm^2$, resulting in crystal nuclei produced on a solid-liquid interface of the amorphous silicon thin film 103 and resulting formation of crystal grains (for example, crystal grains 104a).

As the laser energy density is increased, the amorphous thin film is melted deeper. As a result, larger crystal grains are produced (for example, crystal grains 4b). The production of crystal nucleus from a solid-liquid interface in this way is referred to as "inhomogeneous nucleation." In FIG. 2, Ec indicates a laser energy density at which the solid-liquid interface reaches the insulating base 101. As the laser energy density exceeds Ec, the overall amorphous thin film is melted, and enters into a supercooling state. As a result, crystal nuclei are produced within the thin film at random to form micro-crystals 104c of diameters equal to or less than 0.05 μm. Such production of crystal nuclei is referred to as "homogeneous nucleation."

For fabricating a polycrystalline silicon thin film transistor (TFT) having satisfactory characteristics, for example, a TFT exhibiting a mobility μ of 100 $cm^2/V.s$, the grain diameter of silicon crystals must be 0.2 μm or more. Therefore, the amorphous thin film should be crystallized with the laser energy density set at Ec. In this example, Ec is set at 230 $mJ/cm^2$. It should be noted however that the value of the laser energy density in the prior art may vary since it depends on the nature of the amorphous silicon film (for example, an employed growth method, its film thickness, and so on), the temperature of the base, and the wavelength and pulse width of the excimer laser. Details in this respect are found, for example, in "Applied Physics Letters," vol. 63, no. 14, 1993, pp. 1969–1971, and so on.

FIG. 3 is a schematic plan view showing a positional relationship between semiconductor regions 110, 111 and a gate electrode 113 of a TFT. A channel is formed between the semiconductor regions 110, 111, and the length of the channel is equal to the gate length. The channel length may be, for example, 4 μm. Also, an average crystal grain diameter (crystal diameter 104b) of crystals comprising the polycrystalline silicon thin film is 0.25 μm.

Therefore, it is readily estimated that larger crystal grains are desirably formed in the channel for improving the characteristics of the TFT (increasing the carrier mobility to achieve a faster operation).

Thus, as a technique for forming position-controlled large crystal grains, a method of controlling a laser intensity distribution has been proposed. FIGS. 4a to 4c illustrate the formation of a gate insulating film ($SiO_2$ film) 112, which is patterned to define a region in which large crystal grains should be formed, on a similar structure illustrated in FIG. 1a. As an excimer laser is irradiated, the temperature at a region of an amorphous silicon thin film beneath the gate insulating film 112 becomes higher than the remaining region, so that a resulting temperature distribution is as indicated by a temperature curve 114 in FIG. 4b. In this event, the crystallization initiates from ends of the gate insulating film 112 to form large crystal grains 121a due to a strong (large) temperature slope. Also, in this event, the crystal grains produced from both ends of the gate insulating film 112 grow to collide with one another in a region beneath the gate insulating film 112, resulting in formation of a crystal grain boundary 122, as illustrated in FIG. 4c. In regions other than the region beneath the gate insulating film 112, since the temperature slope is weak (small), a polycrystalline silicon thin film 4 is formed with crystal grains having smaller grain diameters than the crystal grains in the region beneath the gate insulating film 112.

As a technique for forming position-controlled large crystal grains, a method of irradiating excimer laser using a mask 123 is known, as illustrated in FIGS. 5a to 5c (Japanese Journal of Applied Physics, vol. 37, 1998, pp. 5474–5479).

With this technique, the amorphous silicon thin film 103 exhibits a temperature distribution as indicated by a temperature curve 114' shown in FIG. 5b, wherein the temperature is higher in a region which is not covered with the mask 123. Therefore, as illustrated in FIG. 5c, the crystallization advances from an amorphous silicon thin film 103 corresponding to the end of the mask 123 to a region over which the mask 123 does not exist, and larger crystal grains 121a are formed in this region.

SUMMARY OF THE INVENTION

Thin film transistors (TFT) formed using low-temperature polycrystalline silicon (polysilicon) thin films can constitute CMOS (Complementary Metal Oxide Semiconductor) transistors, so that they can be used not only as switching devices for pixels in a liquid crystal display but also as peripheral circuit elements such as a shift register, an AD converter and so on. This is because a low temperature polysilicon thin film (low temperature polysilicon film) formed by excimer laser based crystallization is composed of large crystal grains which exhibit high crystallinity. However, for realizing a system-on-panel (a predetermined electronic apparatus implemented by mounting a plurality of transistors and so on on a single substrate) having high performance and high reliability, it is necessary to develop techniques which accomplish the following targets.

(1) An increased process margin for the excimer, laser energy density.
(2) Crystallization of larger crystal grains having crystal grain diameters of 0.2 µm or more. Here, the crystal grain diameter is measured in the following procedure.
  (a) Determine a region under measurement in a surface area of a polycrystalline semiconductor thin film.
  (b) The area of the region under measurement is 1 µm$^2$.
  (c) Take an electron micrograph of the surface of the region under measurement.
  (d) Crystal grains, each of which is entirely included in the region under measurement of the electron microscopic photograph, i.e., crystal grains, each of which is entirely included on the surface of the region under measurement, are regarded as crystal grains under measurement, and the number of these crystal grains is counted. Also, the total area of the crystal grains under measurement, i.e., the total area of the crystal grains under measurement on the top surface of the region under measurement is measured from the electron micrograph.
  (e) The total area of the crystal grains under measurement is divided by the number of the crystal grains under measurement to derive an average area S of the crystal grains under measurement.
  (f) Assuming that the crystal grains under measurement on the top surface of the region under measurement is circular in shape, the average area S is substituted into an equation $2\sqrt{(S/\pi)}$ to calculate the diameters of the crystal grains.
(3) Control of the position of a crystal grain boundary.
(4) Planarization of a polycrystalline film.
(5) Development of a self-aligned TFT.
(6) Development of a TFT in LDD (Lightly-Doped Drain) structure.

On the other hand, a review on the prior art in view of the foregoing targets of development reveals that a number of problems are found as follows.

As can be seen from FIG. 2, a laser energy region for producing larger crystal grains extends approximately from 10 to 20 mJ/cm$^2$. However, since the existing excimer laser has an output stability of ±10 to 25 J/cm$^2$ at most, a margin for the excimer laser energy density is thought to be extremely small.

Also, Ec in FIG. 2 depends on the thickness of an amorphous silicon thin film. When a change in thickness is 10% or more, a polycrystalline film changed by laser irradiation is a mixture of large crystal grains and small crystal grains. The crystallization of crystal grains having diameters of 0.2 µm or more is difficult to accomplish.

Also, the diameters of resulting crystal grains vary due to a difference in the temperature slope between a region fully irradiated with laser and an end region irradiated less with the laser. The varying crystal grain diameters may cause deviations in density of trap state in a channel region beneath the gate electrode, and a consequent change in the threshold voltage Vth of respective transistors over ±several volts and deviations in the carrier mobility µ spanning approximately ±50 cm$^2$/V.s.

Also, the crystal grain position control technique illustrated in FIGS. 4a to 4c inevitably involves the formation of crystal grain boundaries within the channel region. When a number of crystal grain boundaries exist in the channel region of silicon beneath the gate electrode, the non-uniformity of crystal grains may cause the carrier mobility µ to be reduced to several cm$^2$/V.s due to dispersion of conduction carriers or the like.

Also, as impurities are implanted into a polycrystalline region, the impurities are locally deposited on a crystal grain boundary so that the impurity concentration is difficult to control.

Further, the crystal grain position control technique illustrated in FIGS. 5a to 5c is not capable of forming a self-aligned TFT, and therefore experiences difficulties in a reduction in the size of the TFT.

Furthermore, the silicon channel region beneath the gate electrode is susceptible to the formation of proturberances in a grain boundary corner. The proturberances introduce a lower mobility due to dispersion of carriers, and resulting deviations and degradation in the performance of respective transistors. Particularly, proturberances formed in a drain end portion, if any, would cause a higher likelihood of a concentrated electric field, resulting in a deteriorated transistor due to the production of hot carriers.

It is an object of the present invention to provide a semiconductor device having a thin film transistor which exhibits high performance and high reliability, and an electronic apparatus which incorporates the semiconductor device.

It is another object of the present invention to provide a semiconductor device which has a polycrystalline thin film with crystal grains of larger diameters constituting a channel region of a thin film transistor, and an electronic apparatus which incorporates the semiconductor device.

It is another object of the present invention to provide a semiconductor device which has smaller proturberances in a corner of a crystal grain boundary in a channel region of a thin film transistor, and a polycrystalline thin film comprised of crystal grains with larger diameters as compared with other regions, and an electronic apparatus which incorporates the semiconductor device.

It is another object of the present invention to provide a semiconductor device which has proturberances reduced to 15 nm or less in a corner of a crystal grain boundary in a channel region of a thin film transistor, and a polycrystalline thin film comprised of crystal grains with diameters of 0.2 μm or more, larger than other regions, and an electronic device which incorporates the semiconductor device.

It is another object of the present invention to improve the manufacturing yield of a semiconductor device (for example, a thin film transistor), reduce the manufacturing cost, and provide a high performance electronic apparatus incorporating a thin film transistor at a lower cost.

It is another object of the present invention to provide a semiconductor thin film substrate which is capable of producing crystal grains of larger diameters and reducing proturberances in a corner of a crystal grain boundary.

The above and other objects and novel features of the present invention will become apparent from the description of this specification and the accompanying drawings.

According to a first aspect of the present invention, a semiconductor thin film substrate includes an insulating base, a first non-crystalline thin film formed on the insulating base, a second non-crystalline thin film formed on the first thin film, and a non-crystalline semiconductor thin film formed on the second thin film, wherein the second thin film has a thermal conductivity higher than a thermal conductivity of the first thin film, and lower than a thermal conductivity of the non-crystalline semiconductor thin film. The non-crystalline semiconductor thin film may be an amorphous semiconductor thin film. Also, in this structure, a bulk material forming the second thin film has a thermal conductivity higher than the thermal conductivity of a bulk material forming the first thin film, and lower than the thermal conductivity of a bulk material forming the non-crystalline semiconductor thin film. The first thin film may be a silicon oxide film, the second thin film may be a silicon nitride film, and the non-crystalline semiconductor thin film may be a silicon film. Alternatively, in the composition of the respective films, the first thin film may be a silicon oxide film, the second thin film may be a silicon nitride film, and the non-crystalline semiconductor thin film may be a silicon germanium film. Further alternatively, the first thin film may be a silicon oxide film, the second thin film may be a silicon germanium film, and the non-crystalline semiconductor thin film may be a silicon film. The second thin film may be in contact with the first thin film, while the non-crystalline semiconductor thin film may be in contact with the second thin film.

According to another aspect of the present invention, a semiconductor device includes an insulating base, a first non-crystalline thin film formed on the insulating base, a second non-crystalline thin film formed on at least a portion of a surface of the first thin film, a polycrystalline semiconductor thin film formed on a surface of the second thin film or on the surfaces of the second thin film and the first thin film, and a field effect transistor having a channel formed of a portion of the polycrystalline semiconductor thin film, wherein the second thin film has a thermal conductivity higher than the thermal conductivity of the first thin film and lower than the thermal conductivity of the polycrystalline semiconductor thin film. The first thin film may be a silicon oxide film, the second thin film may be a silicon nitride film, and the non-crystalline semiconductor thin film may be a silicon film. Alternatively, in the composition of the respective films, the first thin film may be a silicon oxide film, the second thin film may be a silicon nitride film, and the non-crystalline semiconductor thin film may be a silicon germanium film. Further alternatively, the first thin film may be a silicon oxide film, the second thin film may be a silicon germanium film, and the non-crystalline semiconductor thin film may be a silicon film. The second thin film may be in contact with the first thin film, while the non-crystalline semiconductor thin film may be in contact with the second thin film.

Crystal grains in the polycrystalline semiconductor thin film constituting the channel may have measured diameters of 0.2 μm or more, wherein the diameters of the crystal grains are measured, for example, in a region occupying an area of 1 μm² having a length of 0.5 μm in upper, lower, left and right directions from the center of a surface region on the gate electrode side of the field effect transistor of the polycrystalline semiconductor thin film constituting the channel, wherein the crystal grains to be measured are selected to be crystal grains which are entirely accommodated in the region under measurement on the surface thereof, wherein assuming that the crystal grains to be measured on the surface of the region under measurement are circular, the diameter is determined by substituting an average area S of the crystal grains to be measured into an equation give by $2\sqrt{(S/\pi)}$. The average area is calculated by dividing a total area of the crystal grains to be measured on the surface of the region under measurement by the number of crystal grains to be measured.

Also, the second thin film may include end portions near the source region and the drain region of the field effect transistor, wherein the end portions are gradually reduced in thickness toward the source region and the drain region, respectively.

The foregoing aspect of the present invention may be applicable to other semiconductor devices of different structures in which an active region is formed in a portion of a polycrystalline semiconductor thin film, for example, to a bipolar transistor and so on.

According to another aspect of the present invention, a semiconductor device is manufactured in the following method. Specifically, the method of manufacturing a semiconductor device comprises the steps of forming a first non-crystalline thin film, a second non-crystalline thin film and a non-crystalline semiconductor thin film on one surface of an insulating base sequentially in laminate, irradiating the non-crystalline semiconductor thin film with laser light to crystallize the non-crystalline semiconductor thin film to form a polycrystalline semiconductor thin film, and forming an active region of a semiconductor element in the polycrystalline semiconductor thin film. The first thin film, the second thin film and the non-crystalline semiconductor thin film mutually have a relationship in terms of the thermal conductivity such that, after a laser light irradiation under the same conditions of the above-mentioned laser light irradiation, the thermal conductivity of the non-crystalline semiconductor thin film is higher than the thermal conductivity of the second thin film, and the thermal conductivity of the second thin film is higher than the thermal conductivity of the first thin film. The non-crystalline semiconductor thin film is formed such that a correlation of a laser energy density irradiated to the non-crystalline semiconductor thin film with a crystal grain diameters of the polycrystalline semiconductor thin film has a normal growth in which crystal grains grow from crystal nuclei to a predetermined size, a first critical energy density Ec at which the normal growth is maximum, a secondary growth in which the crystal grains formed by the first growth fuse with each other in a laser energy density range exceeding the first critical energy density Ec to grow to larger crystal grains, and a second critical energy density Ec' at which the secondary growth is maximum. The non-crystalline semiconductor thin film is irradiated with laser light at a laser energy density higher than the first critical energy density Ec and equal to or lower than the second critical energy density Ec' to form the polycrystalline semiconductor thin film.

The second thin film is disposed in a predetermined pattern on at least a portion of a region of the first thin film corresponding to the channel. The second thin film may be formed in a double-sided comb-shaped pattern having digits, each of which extends along the lengthwise direction of the channel.

A light shielding film formed in a pattern corresponding to the position of the channel of the field effect transistor may be disposed between the first thin film and the second thin film, in which case a source region and a drain region of the field effect transistor may be formed in the polycrystalline semiconductor film region such that the source and drain regions are self aligned to the light shielding film. The source region and the drain region have a lower impurity concentration in portions near the light shielding film than in portions away from the light shielding film.

According to another aspect of the present invention, an electronic apparatus incorporates a semiconductor device comprising a plurality of transistors formed in a polycrystalline semiconductor thin film, wherein the semiconductor device is configured according to any of the foregoing structures. For example, the electronic apparatus may be a liquid crystal display apparatus, in which case the semiconductor device includes transistors for operating respective pixels on a liquid crystal panel of the liquid crystal display apparatus, and transistors forming part of a peripheral driver circuit. The semiconductor device is attached to the liquid crystal display panel overlapping each other.

BRIEF DESCRIPTION OF THE DRAWINGS

FIGS. 18a to 18l are cross-sectional views illustrating respective steps in a method of manufacturing a self-aligned LDD thin film transistor according to another embodiment (sixth embodiment) of the present invention;

DETAILED DESCRIPTION OF THE EMBODIMENTS

Figure 1A:
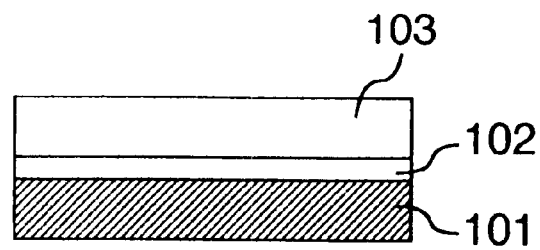
FIGS. 1a to 1d are schematic diagrams illustrating a conventional method of manufacturing a polycrystalline semiconductor thin film substrate, and a field effect transistor.
Figure 1B:
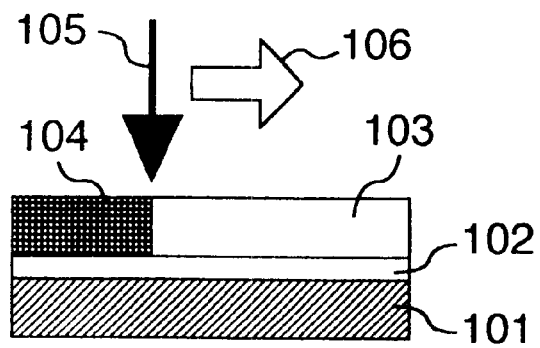
Figure 1C:
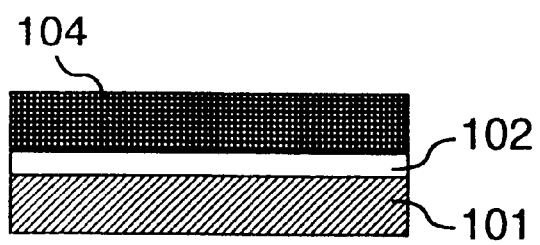
Figure 1D:
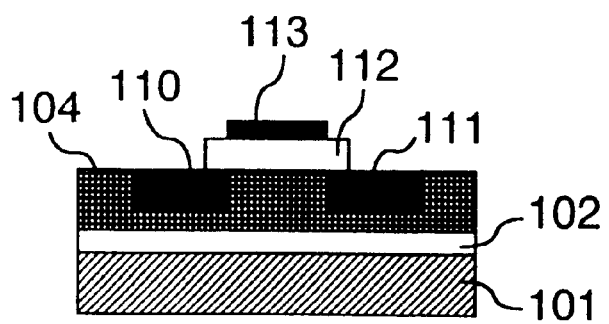

Various embodiments of the present invention will hereinafter be described in detail with reference to the accompanying drawings. It should be first noted that throughout all drawings for explaining embodiments of the present invention, components having the same function are designated the same reference numerals, and repetitive explanation thereof will be omitted.

First Embodiment

Figure 6:
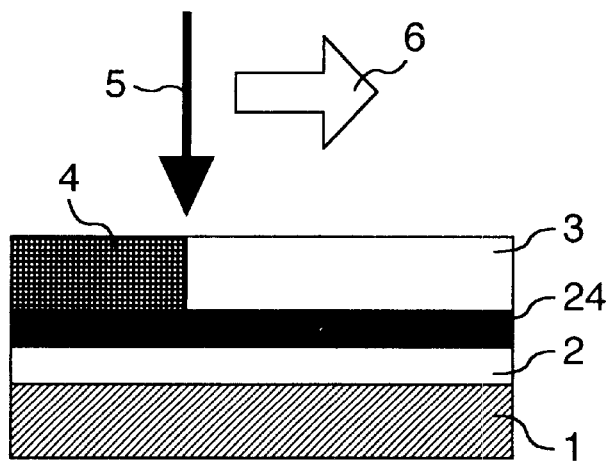
FIG. 6 is a schematic diagram illustrating a method of manufacturing a polycrystalline semiconductor thin film according to one embodiment (first embodiment) of the present invention.
Figure 7:
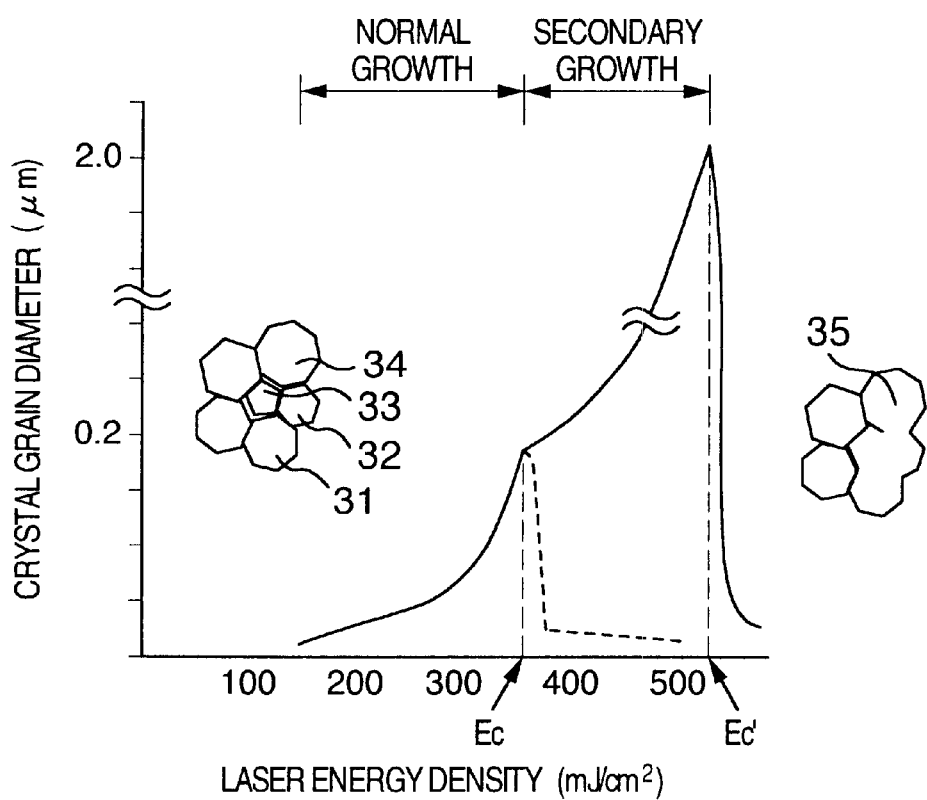
FIG. 7 is a graph showing the correlation of the diameter of crystal grains in a polycrystalline semiconductor thin film and a laser energy density during manufacturing in the embodiment of the present invention.
Figure 8A:
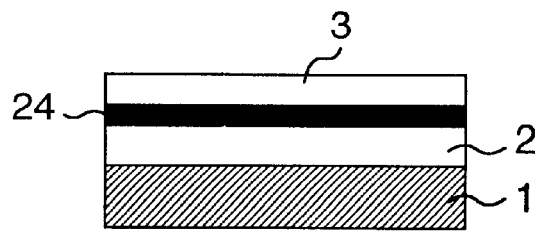
FIGS. 8a to 8d are cross-sectional views illustrating respective steps in a method of manufacturing a thin film transistor according to the first embodiment.
Figure 8B:
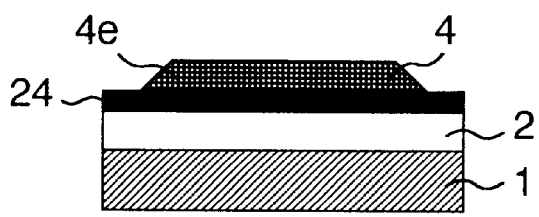
Figure 8C:
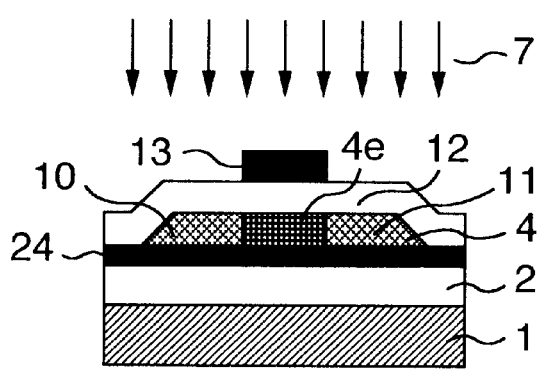
Figure 8D:
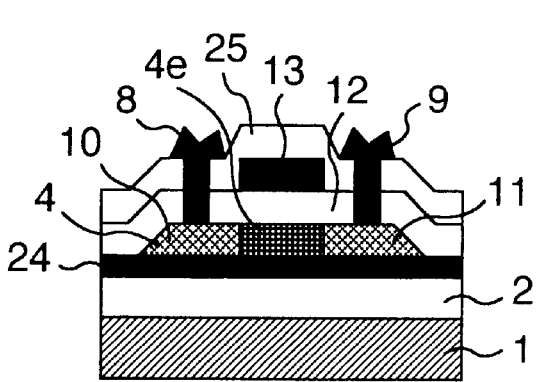
Figure 9:
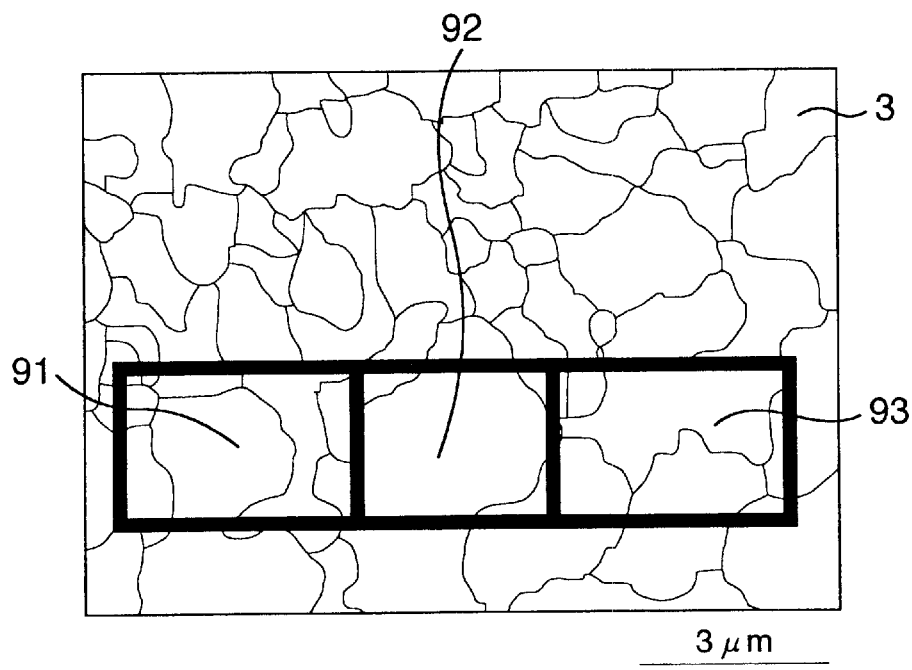
FIG. 9 is a schematic diagram illustrating the layout of a source region, a drain region and a channel region of a thin film transistor in a polycrystalline semiconductor thin film which is formed by the method of manufacturing a polycrystalline semiconductor thin film according to the first embodiment.

FIGS. 6, 7, 8a to 8d, and 9 are diagrams related to a technology involved in manufacturing a semiconductor device having a thin film transistor (TFT) according to an embodiment (first embodiment) of the present invention, and a technology involved in manufacturing a semiconductor thin film substrate (polycrystalline semiconductor thin film substrate) for manufacturing a semiconductor device. Specifically, FIG. 6 is a schematic diagram illustrating a method of manufacturing a polycrystalline semiconductor thin film; FIG. 7 is a graph showing the correlation of the crystal grain diameter in a polycrystalline semiconductor thin film with a laser energy density during the manufacturing; FIGS. 8a to 8d are cross-sectional view illustrating respective steps in a method of manufacturing a thin film transistor; and FIG. 9 is a schematic diagram illustrating the layout of a source region, a drain region and a channel region of the thin film transistor.

FIG. 6 is a diagram related to a method of changing a semiconductor thin film substrate to a polycrystalline semiconductor thin film substrate by irradiating the former with laser beam, according to a first embodiment.

As illustrated in FIG. 6, the semiconductor thin film substrate comprises an insulating base 1, and a non-crystalline first thin film 2, a non-crystalline second thin film 24 and a non-crystalline semiconductor thin film 3 sequentially deposited on (one surface of) the insulating base 1. In the prior art, for example, the first thin film 2, which is a silicon oxide film, is formed on one surface of the insulating base 1 made of glass, and the non-crystalline semiconductor thin film 3, for example, an amorphous semiconductor thin film (for example, an amorphous silicon thin film) is formed on the first thin film 2, whereas in the first embodiment, a silicon nitride film is formed as the second thin film 24 between the silicon oxide film and the amorphous silicon thin film.

Then, in accordance with one feature of the present invention, after a laser light irradiation, a material for the second thin film 24 is selected such that its thermal conductivity (coefficient of thermal conductivity) is higher than the thermal conductivity of the first thin film 2, and is lower than the thermal conductivity of the non-crystalline semiconductor thin film 3. In other words, after a laser light irradiation, the thermal conductivity of a bulk material forming the second thin film 24 is higher than the thermal conductivity of a bulk material forming the first thin film 2, and is lower than the thermal conductivity of a bulk material forming the amorphous semiconductor thin film 3.

Other exemplary structures of the semiconductor thin film substrate, which meet the foregoing conditions, may include a semiconductor thin film substrate comprised of a first thin film made of silicon oxide, a second thin film made of silicon nitride, and a non-crystalline semiconductor thin film made of silicon germanium, or a semiconductor thin film substrate comprised of a first thin film made of silicon oxide, a second thin film made of silicon germanium, and a non-crystalline semiconductor thin film made of silicon. Also, the first embodiment has a structure in which the first thin film 2 is in contact with the second thin film 24, and the second thin film 24 is in contact with the amorphous semiconductor thin film 3.

The semiconductor thin film substrate constructed as described above may be provided per se in the market.

Next, description will be made on a method of changing the semiconductor thin film substrate as described to a polycrystalline thin film substrate.

The first embodiment will be described in connection with an example in which the first thin film 2 is formed of a silicon oxide film on one surface of the insulating base 1 made of glass, the second thin film 24 is formed of a silicon nitride film, and the non-crystalline semiconductor thin film is formed of a silicon film (amorphous silicon film). Alternatively, plastic may also be used for the insulating base 1.

With the semiconductor thin film substrate constructed as described above, the surface of the amorphous semiconductor thin film 3 is irradiated with laser light 5, for example, excimer laser 5 to change the amorphous semiconductor thin film 3 to a polycrystalline semiconductor thin film 4. Alternatively, the laser light 5 may be scanned along the surface of the insulating base 1 as indicated by an arrow 6 to change the overall amorphous semiconductor thin film 3 to the polycrystalline semiconductor thin film 4.

FIG. 7 is a graph showing the relationship between an average crystal grain diameter ($\mu$m) and a laser energy density (mJ/cm$^2$) when the amorphous film (amorphous semiconductor thin film) is changed to a polycrystalline film (polycrystalline semiconductor thin film) in the method of manufacturing a polycrystalline semiconductor thin film illustrated in FIG. 6. The graph (characteristic diagram) is drawn based on experiments made by the present inventors.

Figure 2:
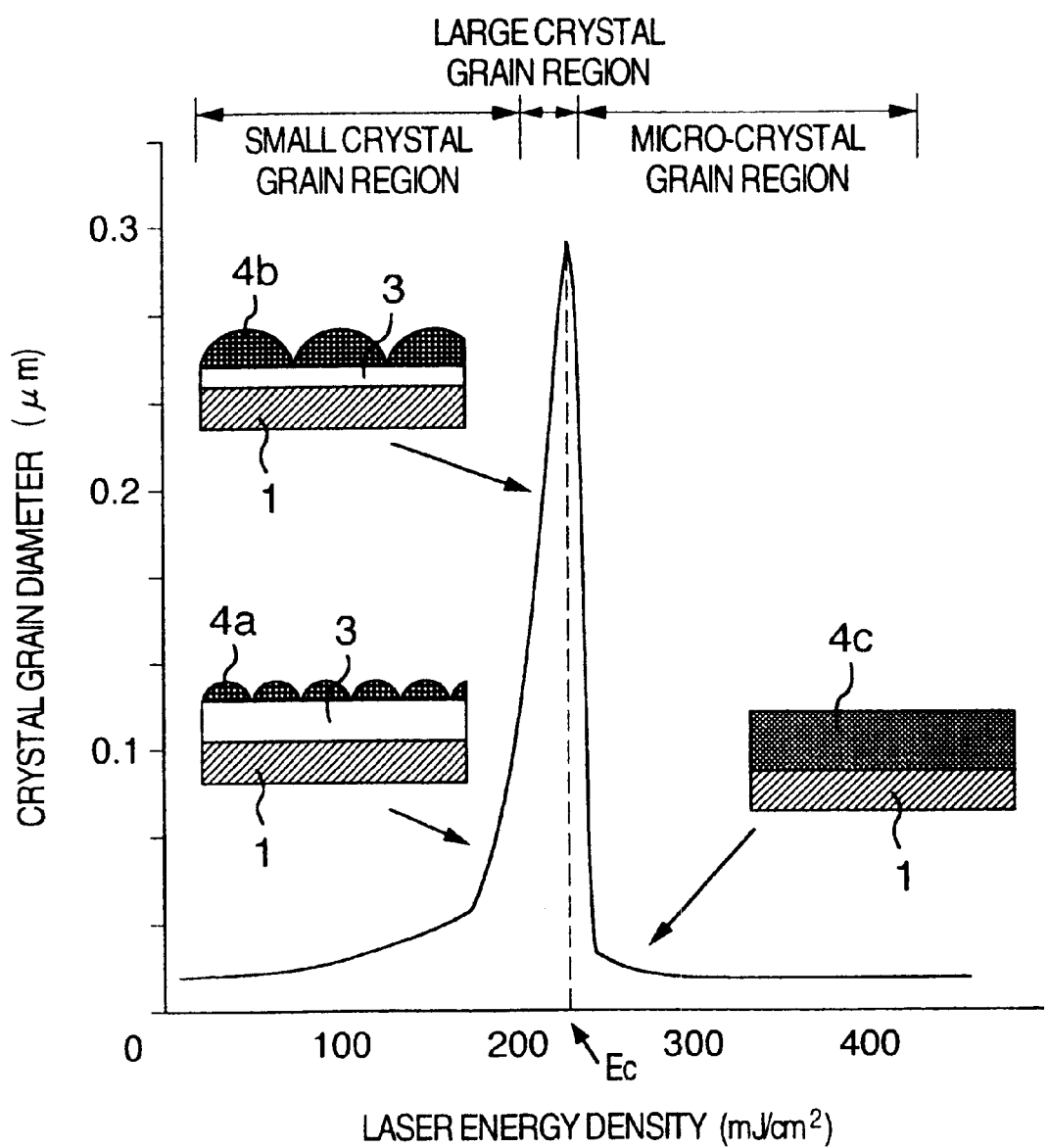
FIG. 2 is a schematic diagram illustrating a graph representing the correlation of a crystal grain diameter with a laser energy density, and a difference in crystal grain diameters depending on the laser energy density in the manufacturing of a conventional polycrystalline semiconductor thin film.
Figure 3:
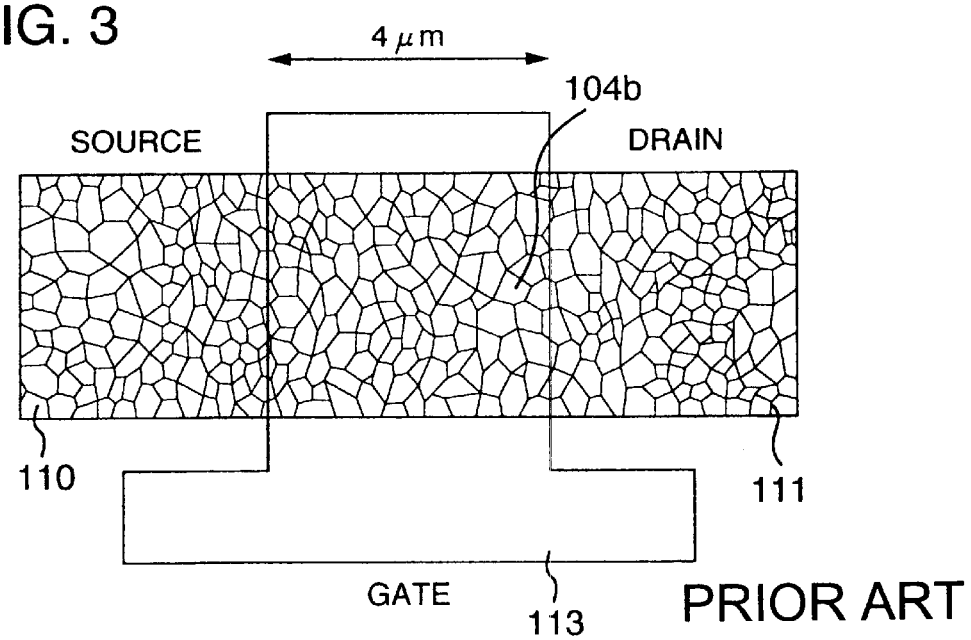
FIG. 3 is a schematic diagram illustrating how crystal grains are produced in a source region, a drain region and a channel region in a conventional field effect transistor.
Figure 4A:
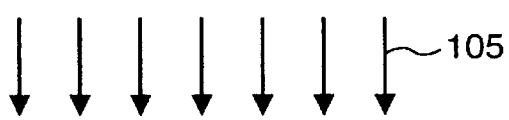
FIGS. 4a to 4c are schematic diagrams illustrating a conventional method of manufacturing a thin film transistor.
Figure 4B:
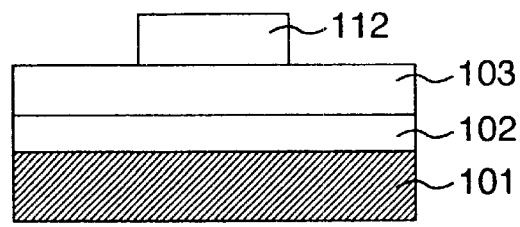
Figure 4C:
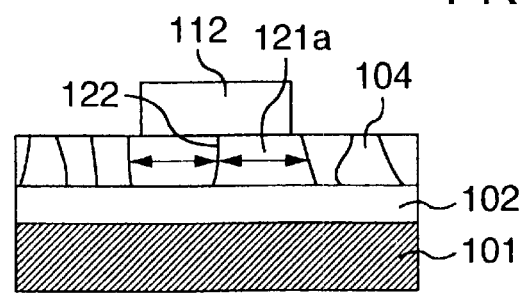
Figure 5A:
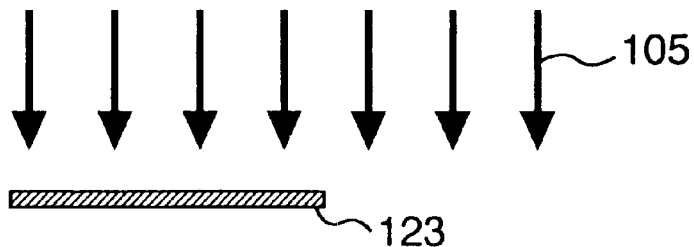
FIGS. 5a to 5c are schematic diagrams illustrating another conventional method of manufacturing a thin film transistor.
Figure 5B:
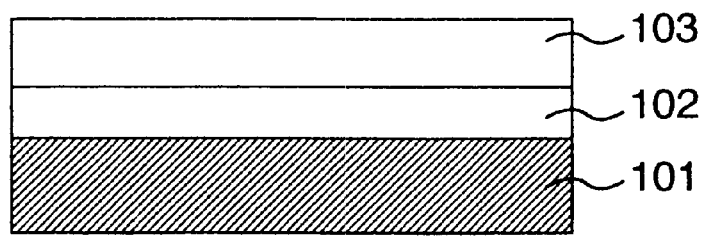
Figure 5C:
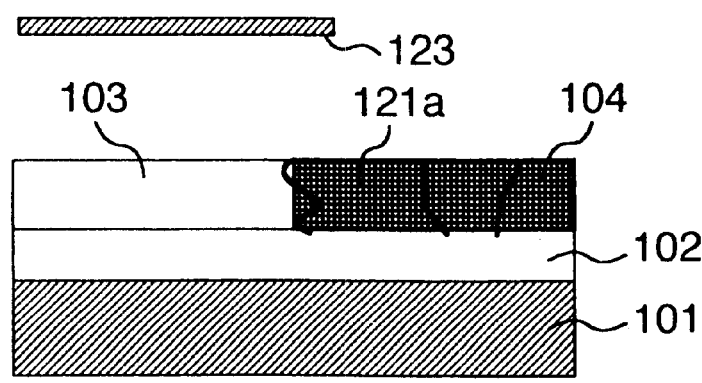

As can be seen from the graph, as the laser energy density is increased, the crystal grain diameter gradually grows, wherein the change is made up of a normal growth referred to by the present inventors, and a secondary growth subsequent to the normal growth in which crystal grains fuse together by re-crystallization to become larger crystal grains. Ec (referred to as the "critical energy density) which indicates a peak of the normal growth curve corresponds to the laser energy density Ec indicative of a peak in FIG. 2. It should be noted that the graph of FIG. 2 shows data which are taken when KrF is used as an excimer laser source, while the graph of FIG. 7 shows data which are taken when XeCl is used as an excimer laser source. Therefore, the two graphs present different values for the critical energy density Ec as a mater of course. The first embodiment may employ a laser having KrF as a laser source.

While the graph of FIG. 7 shows that the crystal grain diameter is approximately 0.2 $\mu$m at the critical energy density Ec, it has been confirmed that the crystal grain diameter grows up to approximately 0.3 $\mu$m depending on a laser light irradiation condition.

According to the change to the polycrystalline thin film in the first embodiment, the secondary growth occurs after the critical energy density Ec by the normal growth, as the laser energy density is further increased. In the secondary growth, crystal grains, which already have grain diameters approximately in a range of 0.2 to 0.3 $\mu$m, further become larger through recombination of the crystal grains. At a peak of the secondary growth curve (i.e., a second critical energy density Ec'), the crystal grain diameter grows up to more or less 2.0 µm at maximum.

In addition, the secondary growth occurs over a wide laser energy density range approximately from 360 mJ/cm$^2$ to 500 mJ/cm$^2$.

Here, as shown in FIG. 7, the normal growth means that crystal grains grow by single crystal nuclei as indicated by reference numerals 31 to 34, and the secondary growth means that crystal grains which have grown in the normal growth recombine through re-crystallization to further grow, as indicated by reference numeral 35.

As the laser energy density exceeds the second critical energy density Ec' (500 mJ/cm$^2$), the crystal grains are micro-crystallized due to the uniform nucleation, so that the crystal grain diameter is reduced to less than 0.05 µm.

It is therefore understood that the crystal grain diameter of 0.2 µm or more, required for high performance TFT, can be realized when the amorphous semiconductor thin film is irradiated with a laser beam at a predetermined laser energy density in the secondary growth range to change to a polycrystalline semiconductor thin film. Also, since the secondary growth occurs in a wide laser energy density range extending approximately over 360 mJ/cm$^2$ to 500 mJ/cm$^2$ and a laser energy margin extends at least to approximately 100 mJ/cm$^2$, the amorphous semiconductor thin film can be stably changed to a polycrystalline semiconductor thin film by appropriately selecting the laser energy density of the laser light irradiated thereto, even if the laser output exhibits a low stability.

Also, the secondary growth process can prevent a mixture of large crystal grains and small crystal grains, as have been found in the prior art, in the normal growth process, and enables the formation of a polycrystalline semiconductor thin film comprised only of crystal grains, the diameter of which is, for example, 0.2 to 0.3 µm or larger. The crystal grain diameter is measured in the aforementioned procedure.

Further, the secondary growth process can suppress deviations in the crystal grain diameter in a portion of the amorphous semiconductor thin film which is fully irradiated with the laser light and in a portion of the amorphous semiconductor thin film which is only irradiated with marginal laser light.

Since larger crystal grains can be provided, a surface proturberance density is reduced in a grain boundary corner, as well as the proturberances, which conventionally measure about 45 nm, are reduced to 15 nm or less.

Since the crystal grain boundary formed by the secondary growth exhibits a high crystallinity, it is possible to suppress local deposition of impurities on the grain boundary.

Next, a method of manufacturing a semiconductor device having a thin film transistor will be described with reference to FIGS. 8a to 8d. The following description will be centered on manufacturing of a single thin film transistor rather than an overall semiconductor device.

First, as illustrated in FIG. 8a, a first thin film 2 and a second thin film 24 are sequentially deposited on the top surface (one surface) of an insulating base 1 in the aforementioned procedure. The insulating base 1 may be made, for example, of glass, fused quartz, sapphire, plastic, polyimide or the like. In the first embodiment, a glass base is used. The first thin film 2 may be made, for example, of an SiO$_2$ film of 300 nm in thickness deposited by a plasma chemical vapor phase growth method with tetraethylorthosilicate (TEOS) and O$_2$, or a thin film of alumina, mica or the like. In the first embodiment, an SiO$_2$ film is used. The second thin film 24 may be made, for example, of a silicon nitride film of 20 nm in thickness deposited by a plasma chemical vapor phase growth method, or a thin film of GaAs, Ge, micro-crystal silicon or the like. In the first embodiment, a silicon nitride film is used.

In addition, an amorphous semiconductor thin film 3 is deposited on the surface of the second thin film 24 to form a multi-layer structure. The amorphous semiconductor thin film 3 may be made, for example, of a thin film of Si, SiGe or the like of 55 nm in thickness formed by a plasma chemical vapor phase growth method. In the first embodiment, an amorphous silicon thin film 3 is formed.

The first thin film 2, the second thin film 24 and the amorphous semiconductor thin film 3 may be deposited, for example, by a plasma chemical vapor phase growth method, a low pressure chemical vapor phase growth method, a sputtering method, or a molecular-beam epitaxy. The thickness of the amorphous semiconductor thin film 3 is desirably 60 nm or less. After a laser light irradiation, the second thin film 24 must have a thermal conductivity higher than the thermal conductivity of the first thin film 2, and lower than the thermal conductivity of the semiconductor thin film 3. For example, the silicon oxide film has the thermal conductivity of 0.014 Wcm$^{-1}$K$^{-1}$; the silicon nitride film, 0.185 Wcm$^{-1}$K$^{-1}$; and the silicon film, 0.273 Wcm$^{-1}$K$^{-1}$.

The multi-layer structure illustrated in FIG. 8a is annealed in a vacuum chamber at 10$^{-4}$ Pa or less at 600° C. for one hour to dehydrogenize the amorphous silicon film. Then, an excimer laser (having KrF, XeCl or the like as a laser source) is irradiated or scanned on the surface of the amorphous semiconductor thin film 3 in order to change the amorphous semiconductor thin film 3 to a polycrystalline semiconductor thin film.

Alternatively, a sample stage for supporting the multi-layer structure may be installed, so that the sample stage is moved instead of moving the excimer laser beam. An energy density E of the excimer laser used for this purpose is a value between Ec and Ec'. Since Ec (critical energy density) and Ec' (second critical energy density) depend on the manufacturing method and thickness of the amorphous semiconductor thin film 3, it will be necessary to determine values for Ec and Ec' beforehand. The excimer laser beam may be punctate or linear in shape (cross-sectional shape). Further, a resistive heater may be provided on the surface or rear surface of the sample stage to heat the substrate at a temperature ranging from 100° C. to 600° C., followed by irradiation of the excimer laser.

The first embodiment used XeCl excimer laser (at wavelength of 308 nm), at an irradiation energy density of 400 mJ/cm$^2$, and the amorphous semiconductor thin film 3 was irradiated with the laser beam 60 times while the sample stage was moved for scanning the surface thereof.

As the excimer laser irradiation is completed, the amorphous semiconductor thin film 3 has been changed to a polycrystalline semiconductor film. Here, a polycrystalline region also includes a single crystal region.

FIG. 9 illustrates the surface structure of a polycrystalline silicon thin film 4 formed according to the first embodiment. FIG. 9 was created by tracing a scanning electron micrograph. Even the smallest crystal grain has a diameter of 0.2 µm or more, so that the polycrystalline silicon thin film 4 satisfies the condition for fabricating a high performance polycrystalline silicon thin film transistor. Also, in the polycrystalline silicon thin film 4, crystal grains with the diameter of 3 μm or more have been actually formed as indicated by rectangular regions 91–93, so that when a source region is formed in the region 91; a channel region in the region 92; and a drain region in the region 93, it is possible to fabricate a thin film transistor which has the performance close to a single crystal transistor.

Turning back to FIG. 8b, the polycrystalline silicon thin film 4 is next patterned in the shape of island 4e so as to include the regions 91, 92, 93 indicated in FIG. 9.

Then, as illustrated in FIG. 8c, a gate insulating film 12 is formed corresponding to the region 92. This gate insulating film 12 may be an $SiO_2$ film of 100 nm in thickness which is formed, for example, by a plasma chemical vapor phase growth with tetraethylorthosilicate (TEOS) and $O_2$. Also, after a gate electrode forming layer has been formed on the $SiO_2$ film 12, the gate electrode forming layer is selectively etched to form a gate electrode 13. The gate electrode 13 is formed as a rectangular pattern which overlaps the region 92 in alignment therewith. The gate electrode 13 may be formed, for example, of a high concentration phosphorus doped polysilicon, W, TiW, $WSi_2$, $MoSi_2$ or the like. In the first embodiment, high concentration phosphorus doped polysilicon is used. The $SiO_2$ film 12 immediately below the gate electrode 13 serves as the substantial gate insulating film 12

Next, as illustrated in FIG. 8c, ions are implanted as indicated by arrows 7 with the gate electrode 13 used as a mask to selectively implant predetermined impurities to form semiconductor regions. These semiconductor regions are subsequently used as a source region or a drain region 10, 11. For example, in this ion implantation 7, P+ may be implanted at a dose on the order of $10^{15}$ $cm^{-2}$ for an N-type TFT, and $BF_{2+}$ may be implanted at a dose on the order of $10^{15}$ $cm^{-2}$ for a P-type TFT. Subsequently, the resultant structure is annealed in an electric furnace at a temperature ranging from 500° C. to 600° C. for approximately one hour with nitrogen used as a carrier gas to activate the impurities. Alternatively, the structure may be annealed by rapid thermal annealing (RTA) at 700° C. for one minute.

Finally, as illustrated in FIG. 8d, an interlayer insulating film 25 is deposited, and contact holes are formed to provide a source electrode 8 and a drain electrode 9. A material suitable for the source electrode 8 and the drain electrode 9 is, for example, Al, W or Al/TiN.

The foregoing first embodiment provides the following effects.

When an amorphous semiconductor thin film is irradiated with laser light at the laser energy density Ec, which is the peak of the normal growth, to form a polycrystalline semiconductor thin film as in the prior art, though crystal grains having diameters of 0.2–0.3 μm can grow, a laser energy density range for increasing the crystal grain diameter is very narrow, i.e., approximately 20 $mJ/cm^2$ as shown in FIG. 2, and the laser output stability is as low as approximately 5% or less, so that the laser energy density presents an extremely low margin, thus making it difficult to grow all crystal grains to have the diameter of 0.2 μm or more. The crystal grains mostly have diameters of even less than 0.2 μm, so that the resulting polycrystalline semiconductor thin film substrate comprised of small crystal grains is far from the eligibility for manufacturing a high performance transistor.

On the other, in the first embodiment, since the laser energy density range for increasing the crystal grain diameter extends widely from 360 $mJ/cm^2$ to 500 $mJ/cm^2$ as shown in FIG. 7, the laser light output can be selected from a wide span, even in view of the laser output stability as low as approximately 5% or less, thereby making it possible to ensure that all crystal grains grow larger, i.e., the crystal grain diameter is increased to more than 0.2–0.3 μm. It is therefore possible to provide a polycrystalline semiconductor thin film substrate which is suitable for manufacturing a high performance semiconductor device.

Accordingly, the laser light output can be selected from a wide span for changing the amorphous semiconductor thin film to the polycrystalline semiconductor thin film, so that a higher margin can be provided for the process involved in the formation of the polycrystalline semiconductor thin film.

Since the polycrystalline semiconductor thin film substrate of the present invention has large crystal grains, crystal grain boundaries are reduced, so that when impurities are implanted thereinto, the impurities are less likely to be locally deposited on the crystal grain boundaries, thereby making it possible to readily form uniform semiconductor regions in a desired impurity concentration. Also, since the crystal grains are formed in a regular structure in the secondary growth, it is possible to suppress the local deposition of the impurities on the grain boundaries. Therefore, the first embodiment can provide a polycrystalline semiconductor thin film substrate suitable for manufacturing a high performance semiconductor device.

Since crystal grains by the secondary growth are formed through recombination of previously grown crystal grains, the resulting crystal grains have larger diameters, and the grain boundary density becomes lower, resulting in a larger carrier mobility μ and accordingly a faster transistor. Further, deviations in the carrier mobility μ can be reduced. Therefore, when a plurality of transistors are formed on a single insulating base 1, the respective transistors exhibit uniform characteristics. For example, deviations in a threshold voltage Vth can be reduced between the respective transistors.

The larger crystal grain diameter results in smaller protuberances in a corner of a crystal grain boundary, and a planarized surface, thereby making it possible to suppress the dispersion of carriers below the gate electrode and accordingly prevent the reduced mobility. Particularly, protuberances in an end region of a drain of a field effect transistor, if any, would cause a higher susceptibility to the concentration of electric field, leading to a deterioration of the transistor due to production of hot carriers. Such a deterioration can also be prevented.

As described above, according to the present invention, a high performance, highly reliable thin film transistor can be provided. Specifically, it is possible to provide a thin film transistor which exhibits, for example, the mobility of 200 $cm^2/V.s$ or higher, and small deviations in device performance.

Second Embodiment

Figure 11:
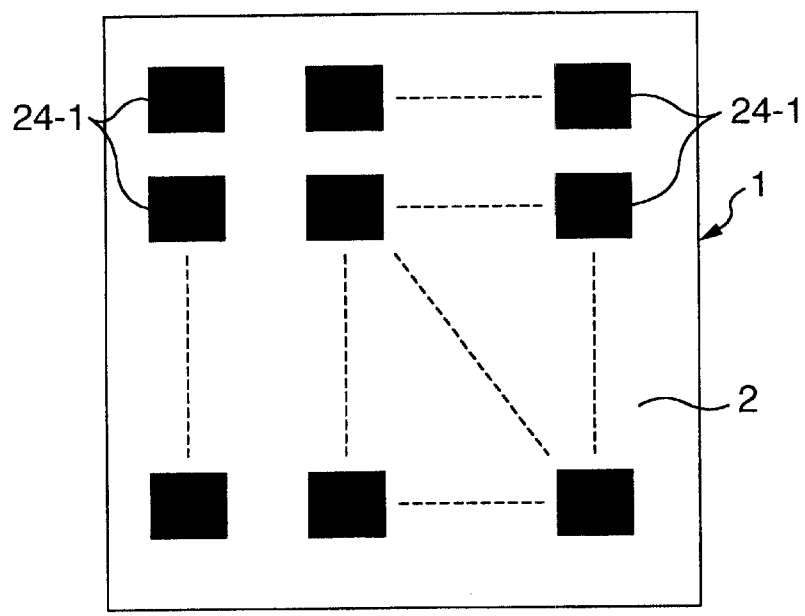
FIG. 11 is a top plan view illustrating a pattern of a second thin film in the manufacturing of the thin film transistors according to the second embodiment.
Figure 10A:
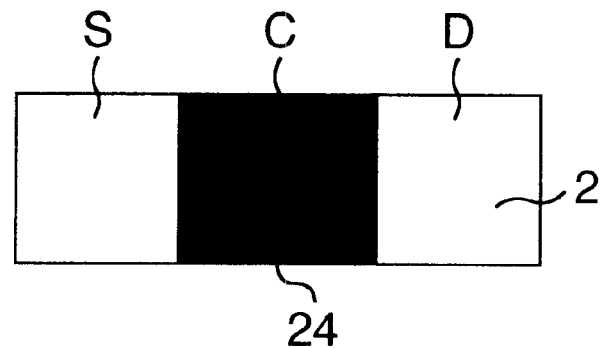
FIGS. 10a to 10c are schematic diagrams illustrating a method of manufacturing a thin film transistor according to another embodiment (second embodiment) of the present invention.
Figure 10B:
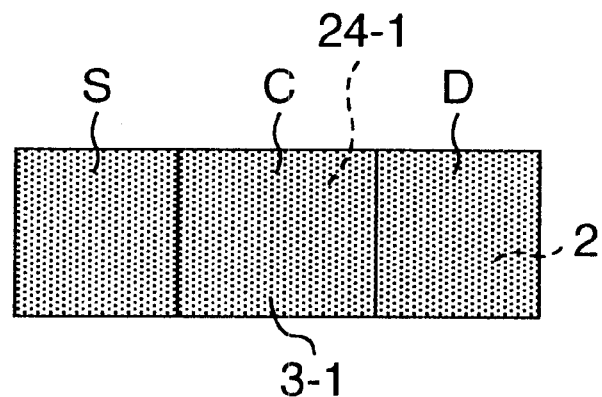
Figure 10C:
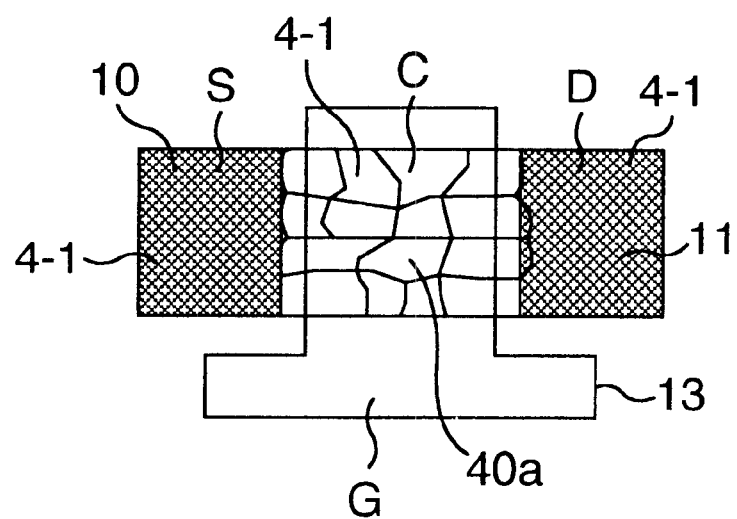

FIGS. 10a to 10c, 11, and 12a to 12d are diagrams related to a method of manufacturing a thin film transistor according to another embodiment (second embodiment) of the present invention. Specifically, FIGS. 10a to 10c are schematic diagrams illustrating the method of manufacturing a thin film transistor; FIG. 11 is a top plan view illustrating a pattern of a second thin film in the manufacturing of the thin film transistor; and FIGS. 12a to 12d are cross-sectional views illustrating respective steps in the method of manufacturing the thin film transistors.

The second embodiment shows an example in which large crystal grains are grown in a channel region corresponding to a gate electrode of a thin film transistor, while crystal grains in regions other than the channel region are left to be micro-crystal grains.

The second embodiment differs from the first embodiment in that a second thin film (silicon nitride film) 24-1 is selectively deposited on a first thin film (silicon oxide film) 2, and an amorphous silicon thin film 3 on the silicon nitride film 24-1 is changed to a polycrystalline silicon thin film 4-1 comprised of large crystal grains.

The second embodiment also includes a method of manufacturing a polycrystalline semiconductor thin film substrate, which is capable of increasing the grain diameter of crystal grains in a channel region of a thin film transistor.

FIGS. 10a to 10c are schematic diagrams which schematically illustrate the layout of a source region S, a drain region D, a channel region C and a gate electrode G of a thin film transistor. In the second embodiment, when a polycrystalline semiconductor thin film substrate is manufactured, the silicon nitride film 24-1 is provided only in the channel region C on the silicon oxide film 2, and no silicon nitride film is provided on the remaining region, as illustrated in FIG. 10a, to increase the grain diameter of crystal grain constituting the polycrystalline semiconductor thin film in the channel region C.

FIG. 11 is a top plan view illustrating a polycrystalline semiconductor thin film which is provided with silicon nitride films 24-1 on portions corresponding to channel regions C on a silicon oxide film 2 deposited over the entire surface of an insulating base 1. As can be seen, this example shows that plurality of thin film transistors can be manufactured in rows and columns.

Turning back to FIG. 10b, an amorphous silicon thin film 3-1 is next formed on the silicon oxide film 2 and the silicon nitride film 24-1, i.e., over the entire surface of the insulating base 1.

Then, as illustrated in FIG. 10c, the amorphous silicon thin film 3-1 is changed to a polycrystalline silicon thin film 4-1 by a method based on laser light irradiation similar to the aforementioned first embodiment. Thus, the polycrystalline silicon thin film 4-1 in the channel region C has large crystal grains 40a. Next, the resulting polycrystalline semiconductor thin film substrate is used to form a thin film transistor as illustrated in FIG. 10c. Since a gate electrode G is formed on the polycrystalline silicon thin film 4-1 comprised of the large crystal grains 40a, the channel region C between a source region S and a drain region D is formed of the large crystal grains 40a, so that a high performance thin film transistor can be manufactured as is the case of the aforementioned first embodiment.

Next, a method of manufacturing a thin film transistor according to the second embodiment will be described with reference to FIGS. 12a–12d. The second embodiment differs from the method of manufacturing a semiconductor transistor according to the first embodiment in that crystal grains are grown larger in a portion of a thin film transistor forming a channel region C.

Figure 12A:
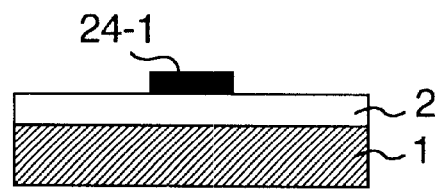
FIGS. 12a to 12d are cross-sectional views illustrating respective steps in the method of manufacturing a thin film transistor according to the second embodiment.
Figure 12B:
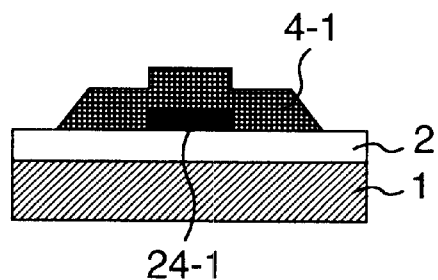

As illustrated in FIG. 12a, after a silicon oxide film 2 and a silicon nitride film are formed on an insulating base 1 made of glass, the silicon nitride film is selectively removed by etching to leave a silicon nitride film 24-1 only in a portion corresponding to the channel region C of the thin film transistor. FIG. 11 illustrates the patterned silicon nitride film 24-1 formed on the silicon oxide film 2. The illustrated pattern of the silicon nitride film 24-1 overlaps gate electrodes G formed on the channel region is C, in alignment therewith. In the second embodiment, each silicon nitride film region 24-1 is substantially square in shape as can be seen in FIG. 11.

Next, though not shown, after an amorphous silicon thin film is formed on the silicon oxide film 2 and the silicon nitride film 24-1, the amorphous silicon thin film is irradiated with laser light for change to a polycrystalline silicon thin film 4-1. This change to the polycrystalline silicon thin film through the laser light irradiation is similar to the first embodiment. Thus, crystal grains in the polycrystalline silicon thin film 4-1 on the silicon nitride film 24-1 grow larger, while crystal grains in regions of the polycrystalline silicon thin film 4-1 not overlapping the silicon nitride film 24-1 remain micro-crystals.

Next, the polycrystalline silicon thin film 4-1 is selectively removed in a manner similar to the first embodiment to leave a portion of the polycrystalline silicon thin film 4-1 on the silicon nitride film 24-1 and portions of the polycrystalline silicon thin film 4-1 on both sides of the silicon nitride film 24-1, which are subsequently formed into a source region and a drain region.

Figure 12C:
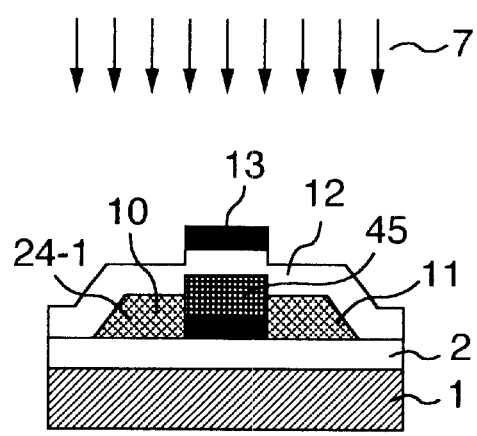
Figure 12D:
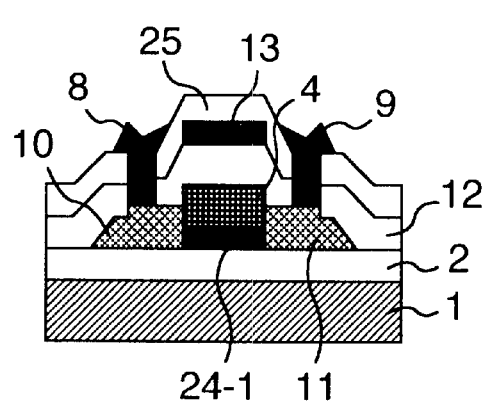

Next, a gate insulating film 12 and a layer subsequently serving as a gate electrode are formed over the entire surface of the insulating base 1, in a manner similar to the first embodiment. Then, the layer subsequently serving as a gate electrode is selectively removed by etching to form a gate electrode 13 which overlaps the silicon nitride film 24-1 as illustrated in FIG. 12c.

Next, ion implantation 7 and annealing are performed with the gate electrode 13 used as a mask in a manner similar to the first embodiment to form the portions of polycrystalline silicon thin film 4-1 not overlapping the silicon nitride film 24-1 into a source region or a drain region 10, 11. Since the portions of the polycrystalline silicon thin film 4-1 not overlapping the silicon nitride film 24-1 are comprised of micro-crystals, impurities can be uniformly introduced into these portions, thereby improving the activation rate.

Subsequently, an interlayer insulating film 25 is deposited, and contact holes are formed to form a source electrode 8 and a drain electrode 9, thus completing a thin film transistor, in a manner similar to the first embodiment. The second embodiment has the structure in which the first thin film is in contact with the second thin film, while the second thin film is in contact with the amorphous semiconductor thin film.

According to the second embodiment, since the channel region C of the thin film transistor has crystal grains of larger diameters, similar effects to those of the first embodiment can be provided. Specifically, in the thin film transistor of the second embodiment, the crystal grains in the channel region have diameters of 0.2 $\mu$m or more, while the crystal grains in the source/drain regions have diameters of 0.1 $\mu$m or less. This enables the realization of a thin film transistor which exhibits the mobility of 200 cm$^2$/V.s or higher, and small deviations in device performance. Here, the measurements of the diameters of the crystal grains constituting the channel region and the source/drain regions are performed in the aforementioned procedure. In the channel region, the measurement is made, for example, in an area having a length of 0.5 $\mu$m in the upward, downward, left and right directions from the center of the surface region of the channel on the gate electrode side.

Third Embodiment

FIGS. 13a to 13d are schematic diagrams illustrating a method of manufacturing a thin film transistor according to another embodiment (third embodiment) of the present invention.

The method of manufacturing a thin film transistor according to the third embodiment will be briefly described with reference to FIGS. 13a to 13d. The third embodiment differs from the second embodiment in that a silicon nitride film 24-2 formed on a silicon oxide film 2 in the shape of square in plan view is provided with slant peripheral faces, as illustrated in FIGS. 13a to 13d. In other words, the silicon nitride film 24-2 becomes thinner toward the outer peripheral edges.

Figure 13A:
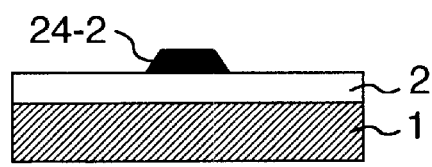
FIGS. 13a to 13d are schematic diagrams illustrating a method of manufacturing a thin film transistor according to another embodiment (third embodiment) of the present invention.

As illustrated in FIG. 13a, a silicon nitride film 24-2 is left only on a portion corresponding to a channel region C of a thin film transistor on a silicon oxide film 2 formed on an insulating base 1 made of glass by the method of the second embodiment. This silicon nitride film 24-2 has slant peripheral faces.

Next, though not shown, after an amorphous silicon thin film is formed on the silicon oxide film 2 and the silicon nitride film 24-2, the amorphous silicon thin film is irradiated with laser light to form a polycrystalline silicon thin film 4-2. The change to the polycrystalline thin film through the laser light irradiation is similar to the aforementioned first embodiment. Thus, crystal grains in the polycrystalline silicon thin film 4-2 on the silicon nitride film 24-2 grow larger, while crystal grains in regions of the polycrystalline silicon thin film 4-2 not overlapping the silicon nitride film 24-2 remains micro-crystals.

Also, in the change to the polycrystalline thin film through the laser light irradiation, the grain diameters become smaller from the channel region toward the source/drain regions in the polycrystalline silicon thin film 4-2 corresponding to the slant faces of the silicon nitride film 24-2.

Figure 13B:
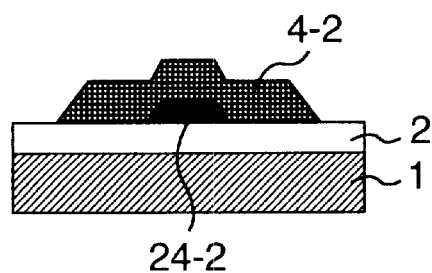

Next, the polycrystalline silicon thin film 4-2 is selectively removed in a manner similar to the second embodiment to leave a portion of the polycrystalline silicon thin film 4-2 on the silicon nitride film 24-2, and portions of the polycrystalline silicon thin film 4-2 on both sides of the silicon nitride film 24-2, which are subsequently formed into a source region and a drain region, as illustrated in FIG. 13b.

Figure 13C:
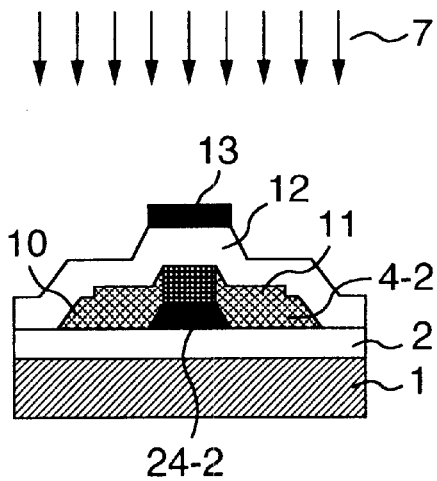
Figure 13D:
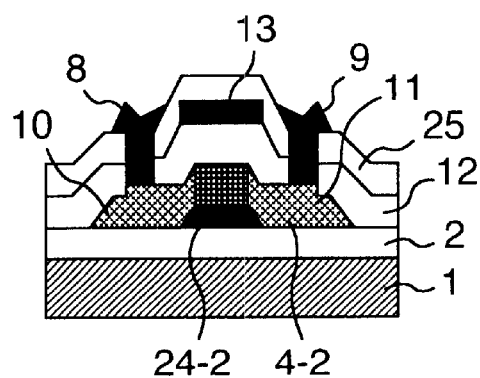

Next, a gate insulating film 12 and a layer subsequently serving as a gate electrode are formed over the entire surface of the insulating base 1, in a manner similar to the second embodiment. Then, the layer subsequently serving as a gate electrode is selectively removed by etching to form a gate electrode 13 which overlaps the silicon nitride film 24-2 as illustrated in FIG. 13c.

Next, ion implantation 7 and annealing are performed with the gate electrode 13 used as a mask in a manner similar to the second embodiment to form the portions of polycrystalline silicon thin film 4-2 not overlapping the silicon nitride film 24-2 into a source region or a drain region 10, 11. Since the portions of the polycrystalline silicon thin film 4-2 not overlapping the silicon nitride film 24-2 are comprised of micro-crystals, impurities can be uniformly introduced into these portions, thereby improving the activation rate.

Subsequently, an interlayer insulating film 25 is deposited, and contact holes are formed to form a source electrode 8 and a drain electrode 9, thus completing a thin film transistor, in a manner similar to the second embodiment. The third embodiment has the structure in which the first thin film is in contact with the second thin film, while the second thin film is in contact with the amorphous semiconductor thin film.

According to the third embodiment, the channel region C of the thin film transistor has crystal grains of larger diameters. In the thin film transistor of the third embodiment, the crystal grains in the channel region have diameters of 0.2 $\mu$m or more, while the crystal grains in the source/drain regions have diameters of 0.1 $\mu$m or less. In addition, since the grain diameters in the polycrystalline silicon film on the tapered second thin film become smaller from the channel region to the source/drain regions after the irradiation of the excimer laser, it is possible to suppress concentration of electric field in an end portion of the drain and accordingly prevent a deterioration of the transistor. This enables the realization of a highly reliable thin film transistor which exhibits the mobility of 200 $cm^2$/V.s or higher, and small deviations in device performance.

Fourth Embodiment

Figure 14A:
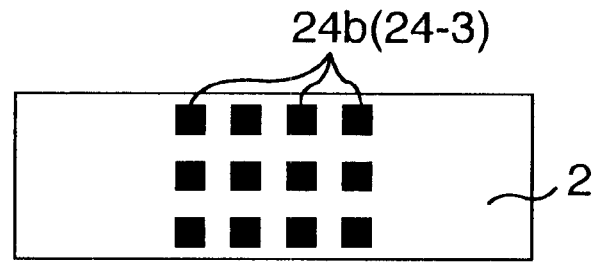
FIGS. 14a to 14c are schematic diagrams illustrating a method of manufacturing a thin film transistor according to another embodiment (fourth embodiment) of the present invention.
Figure 14B:
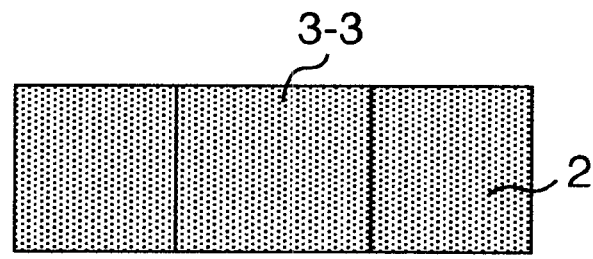
Figure 14C:
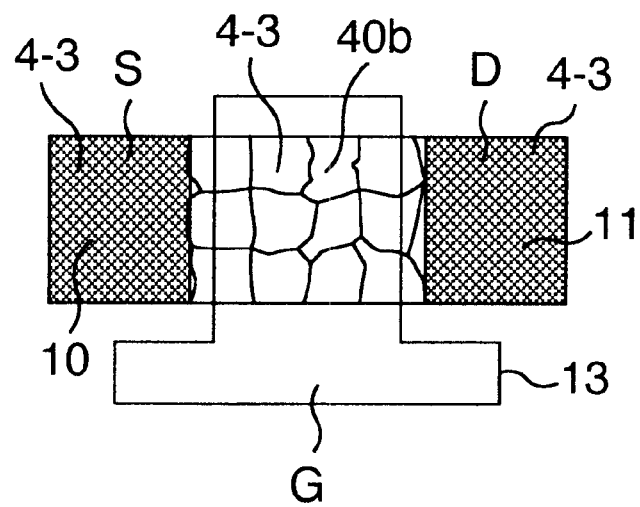
Figure 15:
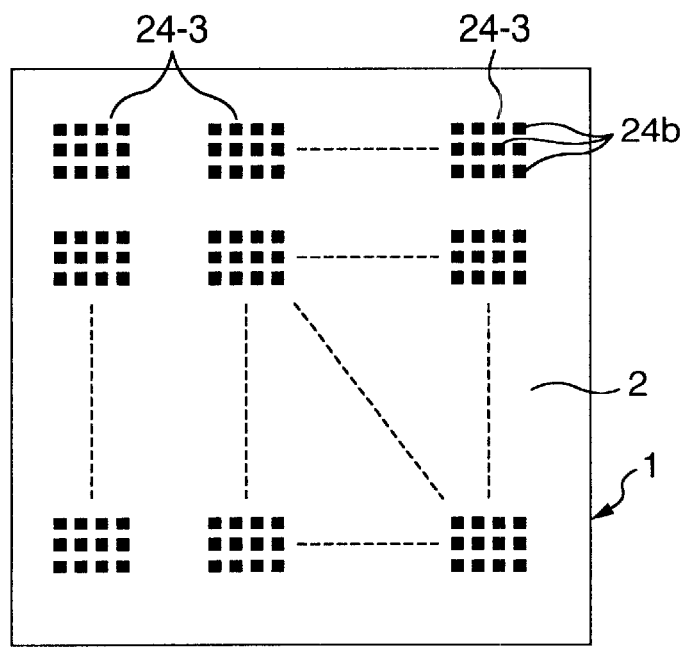
FIG. 15 is a top plan view illustrating a pattern of a second thin film arranged in a matrix in the manufacturing of the thin film transistors according to the fourth embodiment.

FIGS. 14a to 14c and FIG. 15 are diagrams related to a method of manufacturing a thin film transistor according to another embodiment of the present invention (fourth embodiment). Specifically, FIGS. 14a to 14c are schematic diagrams illustrating the method of manufacturing a thin film transistor; and FIG. 15 is a top plan view illustrating a pattern of a second thin film arranged in a matrix in the manufacturing of the thin film transistors.

The fourth embodiment shows an example similar to the second embodiment in which large crystal grains are grown in a channel region corresponding to a gate electrode of a thin film transistor, while crystal grains in regions other than the channel region are left to be micro-crystal grains. In the second embodiment, the silicon nitride film 24-1 is formed in a single square for a thin film transistor, whereas a silicon nitride film 24-3 in the fourth embodiment is formed of a plurality of thin film elements 24b disposed independently of one another, i.e., a plurality of mutually independent thin film elements 24b arranged in a matrix.

FIGS. 14a to 14c are schematic diagrams illustrating the layout of a source region S, a drain region D, a channel region C and a gate electrode G of a thin film transistor. In the fourth embodiment, when a polycrystalline semiconductor thin film substrate is manufactured, the silicon nitride film 24-3 is provided only in the channel region C on a silicon oxide film 2, and no silicon nitride film is provided in the remaining region, as illustrated in FIG. 14a, to increase the grain diameter of crystal grains constituting the polycrystalline semiconductor thin film in the channel region C. In this event, the silicon nitride film 24-3 is comprised of the plurality of mutually independent thin film elements 24b arranged in a matrix. In the fourth embodiment, the silicon nitride film 24-3 is comprised of a total of 12 thin film elements 24b, arranged in a matrix of four columns vertically and three rows horizontally, as illustrated in FIGS. 14a and 15.

FIG. 15 is a top plan view illustrating a polycrystalline semiconductor thin film which is provided with a plurality of mutually independent thin films 24-3 arranged in a matrix on portions corresponding to channel regions C on the silicon oxide film 2 deposited over the entire surface of an insulating base 1.

Turning back to FIG. 14b, an amorphous silicon thin film 3-3 is next formed on the silicon oxide film 2 and the silicon nitride film 24-3, i.e., over the entire surface of the insulating base 1.

Then, as illustrated in FIG. 14c, the amorphous silicon thin film 3-3 is changed to a polycrystalline silicon thin film 4-3 by a method based on laser light irradiation similar to the aforementioned second embodiment. Thus, crystal grains 40a in the channel region C grow larger. Also, according to the fourth embodiment, since one crystal grain is formed corresponding to each thin film element 24b, further larger crystal grains 40b can be formed as compared with the second embodiment. It should be noted that the silicon nitride film elements 24b are not limited to square in shape, but may be circular or triangular, and may have a size of 0.2 μm or larger, by way of example.

Next, the resulting polycrystalline semiconductor thin film substrate is used to form a thin film transistor as illustrated in FIG. 14c. Since the channel region C between a source region S and a drain region D is formed of the large crystal grains 40b, a high performance thin film transistor can be manufactured as is the case of the aforementioned second embodiment. In addition, the fourth embodiment has the structure in which the first thin film is in contact with the second thin film, while the second thin film is in contact with the amorphous semiconductor thin film.

Fifth Embodiment

Figure 17:
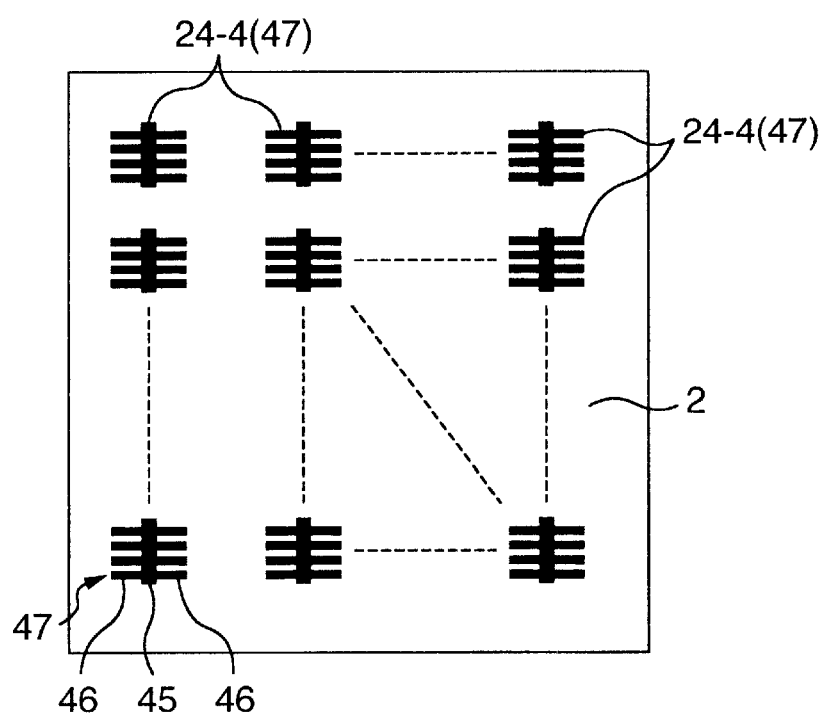
FIG. 17 is a top plan view illustrating a second thin film in a comb-shaped pattern in the manufacturing of the thin film transistors according to the fifth embodiment.
Figure 16A:
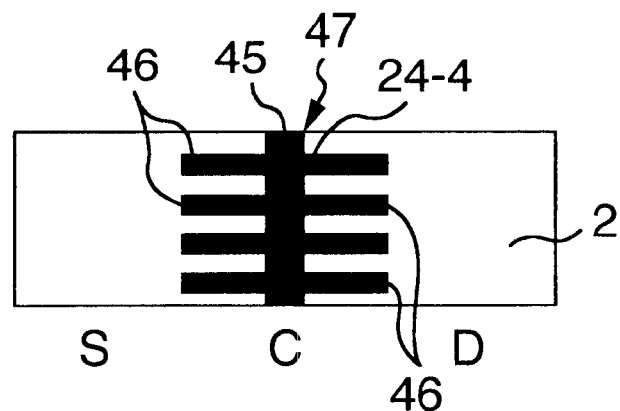
FIGS. 16a to 16c are schematic diagrams illustrating a method of manufacturing a thin film transistor according to another embodiment (fifth embodiment) of the present invention.
Figure 16B:
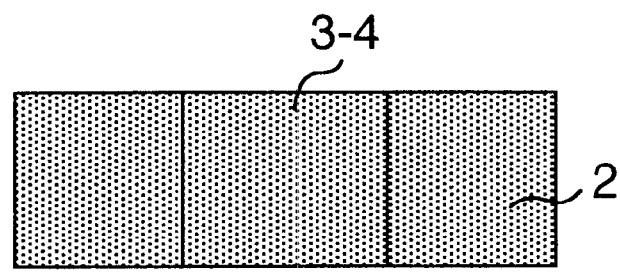
Figure 16C:
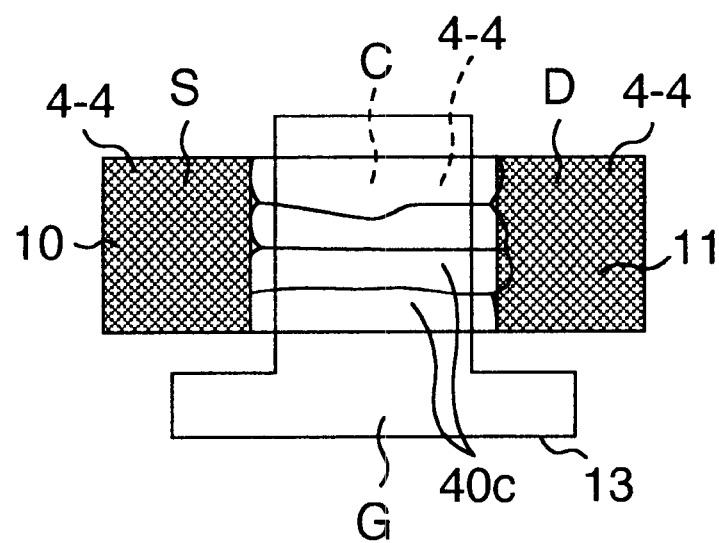

FIGS. 16a to 16c and 17 are diagrams related to a method of manufacturing a thin film transistor according to another embodiment of the present invention (fifth embodiment). Specifically, FIGS. 16a to 16c are schematic diagram illustrating the method of manufacturing a thin film transistor, and FIG. 17 is a top plan view illustrating a second thin film in a comb-shaped pattern in the manufacturing of thin film transistors.

The fifth embodiment shows an example similar to the second embodiment in which large crystal grains are grown in a channel region corresponding to a gate electrode of a thin film transistor, while crystal grains in regions other than the channel region are left to be micro-crystal grains. The second embodiment uses the silicon nitride film 24-1 formed in a single square for a thin film transistor, whereas the fifth embodiment uses a patterned silicon nitride film 24-4. The silicon nitride film 24-4 has a double-sided comb shape 47 which is comprised of a single connecting rod 45 extending in a direction orthogonal to a direction in which a current flows in a thin film transistor, i.e., in a channel direction, and elongated digits 46 symmetrically extending from both sides of the connecting rod 45.

The elongated digits 46 disposed at symmetrical positions on both sides of the connecting rod 45 serve as a silicon nitride film, inclusive of the connecting rod 45, which as a whole extend substantially in parallel with the channel length direction. The silicon nitride film has a constant width in the channel length direction. This is important since an elongated single large crystal grain 40c is formed extending between a source and a drain corresponding to the silicon nitride film, as illustrated in FIG. 16c.

FIGS. 16a to 16c are schematic diagrams illustrating the layout of a source region S, a drain region D, a channel region C and a gate electrode G of a thin film transistor. In the fifth embodiment, when a polycrystalline semiconductor thin film substrate is manufactured, the silicon nitride film is provided only in the channel region C on a silicon oxide film 2, and no silicon nitride film is provided in the remaining region, as illustrated in FIG. 16a, to increase the grain diameter of crystal grains constituting the polycrystalline semiconductor thin film in the channel region C. In this event, the silicon nitride film 24-4 is formed in the double-sided comb-shaped pattern. FIG. 17 is a top plan view illustrating a polycrystalline semiconductor thin film which is provided with silicon nitride films 24-4 arranged in the double-sided comb-shaped pattern on portions corresponding to channel regions C on the silicon oxide film 2 deposited over the entire surface of an insulating base 1.

Turning back to FIG. 16b, an amorphous silicon thin film 3-4 is next formed on the silicon oxide film 2 and the silicon nitride film 24-4, i.e., over the entire surface of the insulating base 1.

Next, as illustrated in FIG. 16c, the amorphous silicon thin film 3 is changed to a polycrystalline silicon thin film 4-4 by a method based on laser light irradiation similar to the aforementioned second embodiment. Thus, the polycrystalline silicon thin film 4-4 in the channel region C has large crystal grains 40a. Also, according to the fifth embodiment, continuous elongated large crystal grains 40c are formed between a source and a drain, corresponding to the silicon nitride film 24-4 of the shape mentioned above.

Next, the resulting polycrystalline semiconductor thin film substrate is used to form a thin film transistor as illustrated in FIG. 16c. Since the channel region C between a source region S and a drain region D is formed of the large crystal grains 40c which are further larger as compared with those in the second embodiment, a thin film transistor having a larger carrier mobility can be manufactured. In addition, the fifth embodiment has the structure in which the first thin film is in contact with the second thin film, while the second thin film is in contact with the amorphous semiconductor thin film.

Sixth Embodiment

FIGS. 18a to 18l are diagrams related to a method of manufacturing a self-aligned LDD-type thin film transistor according to another embodiment (sixth embodiment) of the present invention. These figures are cross-sectional views illustrating various steps in the method of manufacturing the thin film transistor.

The sixth embodiment uses a gate electrode as a mask for impurity implantation and relies on the self alignment to form a source region and a drain region to reduce the size of a thin film transistor (element). In addition, the employment of the LDD structure is intended to prevent a deterioration of the transistor.

The sixth embodiment may be applied to the aforementioned thin film transistors according to the third to fifth embodiments. For example, the following description will be made on an example in which a square second thin film is deposited corresponding to the gate electrode of the third embodiment.

As illustrated in FIG. 18l, the thin film transistor according to the sixth embodiment comprises a square second thin film (silicon nitride film) 24 on a first thin film (silicon oxide film) 2 formed on one surface of an insulating base 1; a light shielding film 15 having the size corresponding to the gate electrode 13 between the first thin film 2 and the second thin film 24; and semiconductor regions resulting from implantation of impurities for forming a source region or a drain region 10, 11 of a thin film transistor, in a polycrystalline semiconductor thin film region 4-5 positioned out of one end of the light shielding film 15 and in a polycrystalline semiconductor thin film region 4-5 positioned out of the other end opposite to the one end of the light shielding film 15. The semiconductor regions include low impurity concentration regions on one end side and the other end side of the light shielding film 15 (LDD structure). The light shielding film 15, the second thin film 24-5 and the gate electrode 13 have the same size and are overlapped one above the other in alignment with one another. Therefore, when ions are implanted with the gate electrode 13 used as a mask, the source region 10 and the drain region 11 formed by the ion implantation are aligned by the gate electrode 13 (self-alignment) to reduce the size of the thin film transistor.

Figure 18A:
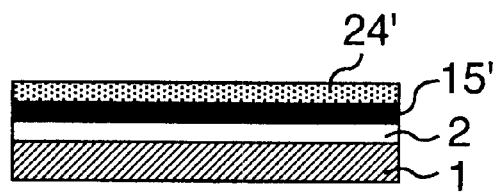

Next, the method of manufacturing a self-aligned LDD-type thin film transistor according to the sixth embodiment will be described with reference to FIGS. 18a to 18l. First, as illustrated in FIG. 18a, a first thin film 2 (for example, a SiO$_2$ film of 300 nm in thickness deposited by a plasma chemical vapor phase growth method using tetraethylorthosilicate (TEOS) and O$_2$, or a thin film of alumina, mica or the like) is deposited on one surface of an insulating base 1 (for example, made of glass, fused quartz, sapphire, plastic, polyimide or the like), and a metal film (for example, made of Cr, W) is formed on the surface of the first thin film as the light shielding film 15' by a sputtering method or the like. The light shielding film (metal film) 15' may be made thick enough to shield light. A second thin film 24' (for example, a silicon nitride film of 20 nm in thickness deposited by a plasma chemical vapor phase growth method, GaA, Ge, micro-crystal silicon or the like) is formed on the metal film 15.

Figure 18B:
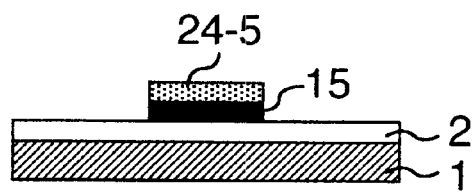

Next, as illustrated in FIG. 18b, the metal film 15' and the second thin film 24' are patterned in the shape of squares 15, 24-5 to correspond to a gate electrode of a thin film transistor using a dry etching method. Alternatively, the second thin film 24-5 may be tapered as previously described in the second embodiment.

Figure 18C:
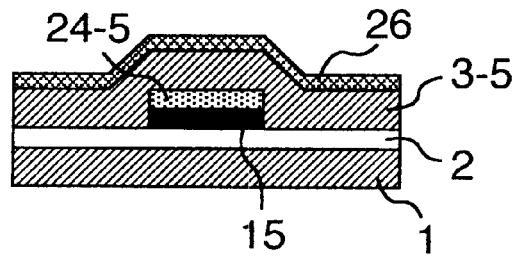

Next, as illustrated in FIG. 18c, an amorphous semiconductor film 3-5 is deposited (for example, Si, SiGe or the like of 55 nm in thickness by a plasma chemical vapor phase growth method) on the surface of the second thin film 24-5 to build a multi-layer structure. The deposition of the first thin film, the second thin film and the amorphous semiconductor film is based on a plasma chemical vapor phase growth method, a low pressure chemical vapor phase growth method, a sputtering method, a molecular-beam epitaxy. The thickness of the amorphous semiconductor thin film 3-5 is desirably, for example, 60 nm or less. After a laser light irradiation, the second, thin film 24-5 must have a thermal conductivity higher than the thermal conductivity of the first thin film 2, and lower than the thermal conductivity of the amorphous semiconductor thin film 3-5. For example, the silicon oxide film has the thermal conductivity of 0.014 Wcm$^{-1}$K$^{-1}$; the silicon nitride film, 0.185 Wcm$^{-1}$K$^{-1}$; and the silicon film, 0.273 Wcm$^{-1}$K$^{-1}$.

The multi-layer structure is annealed in a vacuum chamber at 10$^{-4}$ Pa or less at 600° C. for one hour to dehydrogenize the amorphous silicon film.

Next, as illustrated in FIG. 18c, the amorphous semiconductor film 3-5 is processed into an island shape, and a resist 26 is applied on the island-shaped amorphous semiconductor film 3-5, and baked.

Figure 18D:
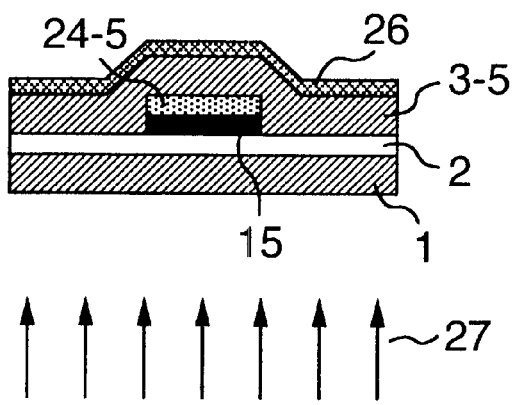
Figure 18E:
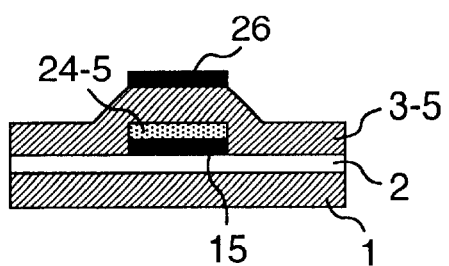
Figure 18F:
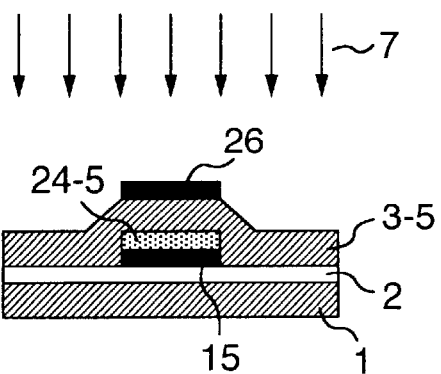
Figure 18G:
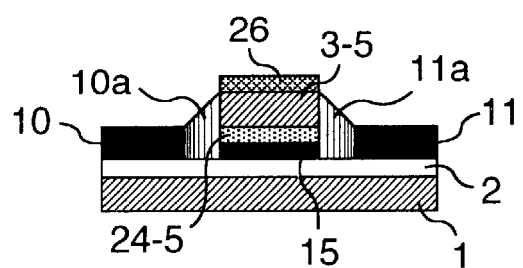

Next, as illustrated in FIG. 18d, the resulting structure is irradiated with light 27 from the back surface thereof for exposure. In this event, the resist 26 may be exposed with light at wavelength of 435 nm. In this event, the light shielding film 15 serves as a mask to expose the resist 26. When the resist 26 is developed, a portion of the resist 26 corresponding to the light shielding film 15 remains as illustrated in FIG. 18e. Then, the remaining resist 26 is used as a mask to implant ions as indicated by arrows 7 in FIG. 18f to form a source region 10 and a drain region 11 as illustrated in FIG. 18g. For example, in this ion implantation 7, P+ may be implanted at a dose on the order of 10$^{15}$ cm$^{-2}$ for an N-type TFT, and BF$_2$+ may be implanted at a dose on the order of 10$^{15}$ cm$^{-2}$ for a P-type TFT. Here, a boundary 10a between the source and the gate and a boundary 11a between the drain and the gate are implanted with ions in a low concentration due to the fact that the amorphous semiconductor thin film 3-5 has a larger thickness on a step portion between the second thin film 24-5 and the first thin film 2, so that an LDD structure is formed in consequence. Also, the ion implanted regions are implanted with ions in a self aligned manner with the resist 26 used as a mask. This allows for the formation of a smaller transistor element. Subsequently, the resist 26 is removed.

Figure 18H:
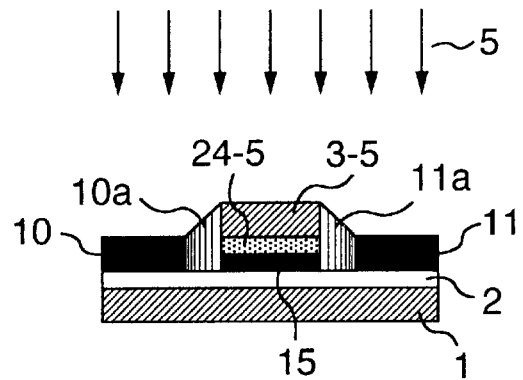

Next, as illustrated in FIG. 18h, the entire structure is irradiated with laser light 5 such as an excimer laser (KrF, XeCl or the like) to change the amorphous semiconductor thin film 3-5 to a polycrystalline semiconductor thin film and to activate the impurity implanted regions. Alternatively, instead of moving the excimer laser beam, a sample stage for supporting the insulating base (multi-layer structure) may be installed so that the sample stage is moved. An energy density E of the excimer laser used for this purpose is a value between Ec (critical energy density) and Ec' (second critical energy density). Ec and Ec' take values which have been defined with reference to FIG. 7. Since Ec and Ec' depend on a particular manufacturing method and a thickness of the amorphous semiconductor thin film 3-5, Ec and Ec' are determined when these parameters are chosen. The excimer laser beam may be punctate or linear in shape. Also, the excimer laser may be repeatedly irradiated two times or more. Further, a resistive heater may be provided on the surface or rear surface of the sample stage to heat the substrate at a temperature ranging from 100° C. to 600° C., followed by irradiation of the excimer laser. Here, an XeCl excimer laser (at wavelength of 308 nm) was used at an irradiation energy density of 400 mJ/cm$^2$, and the amorphous semiconductor thin film 3-5 was irradiated with the laser beam 60 times. As the excimer laser irradiation is completed, the amorphous semiconductor thin film 3-5 has been changed to a polycrystalline semiconductor film. In addition, the impurity implanted regions 10, 10a, 11a, 11 have been activated. Here, a polycrystalline region may also include a single crystal region.

Figure 18I:
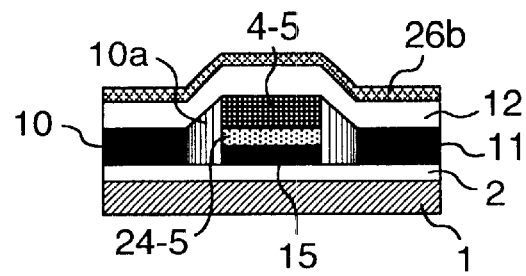
Figure 18I:
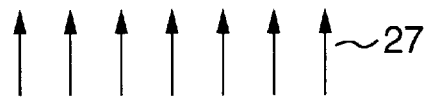
Figure 18J:
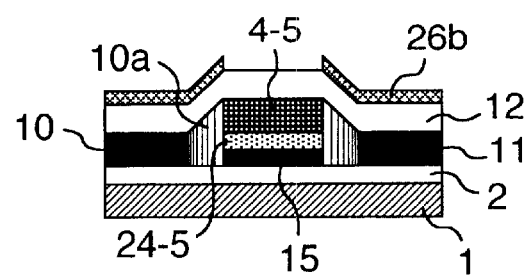

Next, as illustrated in FIG. 18i, an SiO$^2$ film 12 of 100 nm in thickness is deposited as a gate insulating film by the plasma chemical vapor phase growth using tetraethylorthosilicate (TEOS) and O$_2$. Then, a resist 26b is applied on the SiO$^2$ film 12 and baked. The resist 26b is exposed from the back surface of the multi-layer structure with light 27 at wavelength of 435 nm to remove portions of the resist 26b in exposed regions, as illustrated in FIG. 18j.

Figure 18K:
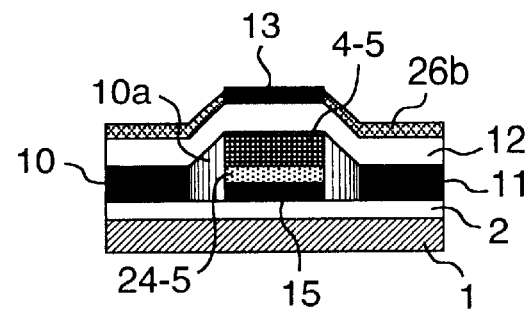
Figure 18K:
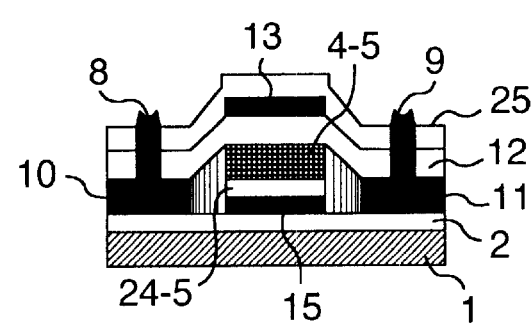

Next, when a layer for forming a gate electrode 13 is provided on the one surface of the insulating base 1, and the remaining resist 26b is removed, a portion of the layer remains by the action of lift-off to form the gate electrode 13 (see FIG. 18k). The layer for forming the gate electrode 13 may be formed, for example, of polysilicon heavily doped 0. with phosphor, W, TiW, WSi$_2$, MoSi$_2$ or the like.

Finally, as illustrated in FIG. 18l, an interlayer insulating film 25 is deposited, and contact holes are formed to provide a source electrode 8 and a drain electrode 9. A material suitable for the source electrode 8 and the drain electrode 9 is, for example, Al, w, Al/TiN. In addition, the sixth embodiment has the structure in which the first thin film is in contact with the second thin film, while the second thin film is in contact with the amorphous semiconductor thin film.

In the thin film transistor according to the sixth embodiment, the crystal grains in the channel region have diameters of 0.2 μm or more, while the crystal grains in the source/drain regions have diameters of 0.1 μm or less. This enables the realization of a self-aligned thin film transistor which exhibits high performance with the mobility of 200 cm²/V.s or higher, and a high reliability with small deviations in device performance. Also, since the metal film 15 serves as a light shielding mask, the metal film 15 can prevent an optical deterioration due to back light.

Further, during the implantation of impurities, since the light shielding film, and the amorphous semiconductor thin film on the second thin film overlapping in alignment with the light shielding film extend slantly along the side faces of the second thin film, they are thicker than the remaining portion, so that portions of the amorphous semiconductor thin film immediately below the thicker portions are implanted with a less amount of impurities. As a result, portions of the semiconductor region near the gate insulating film, which are later formed into a source region and a drain region, have a low impurity concentration. Consequently, a high electric voltage otherwise produced at gate/drain ends can be relieved to suppress the production of hot carriers, thereby preventing a deterioration of the transistor.

Seventh Embodiment

Figure 19A:
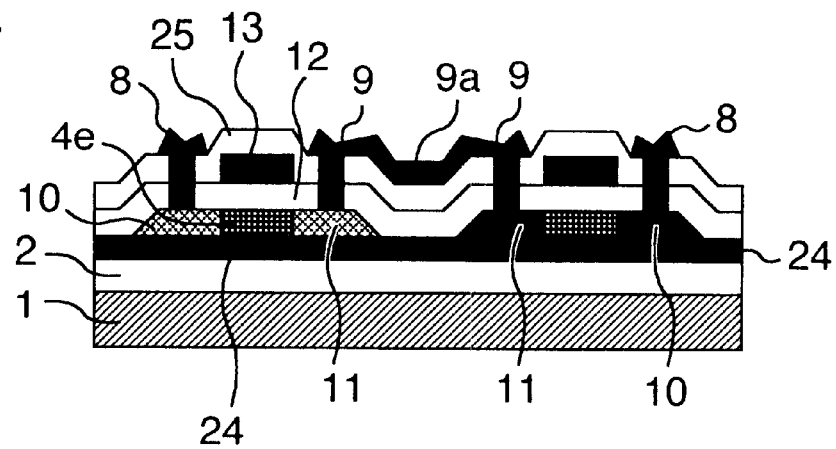
FIGS. 19a to 19c are cross-sectional views illustrating an exemplary CMOS transistor according to another embodiment (seventh embodiment) of the present invention.
Figure 19B:
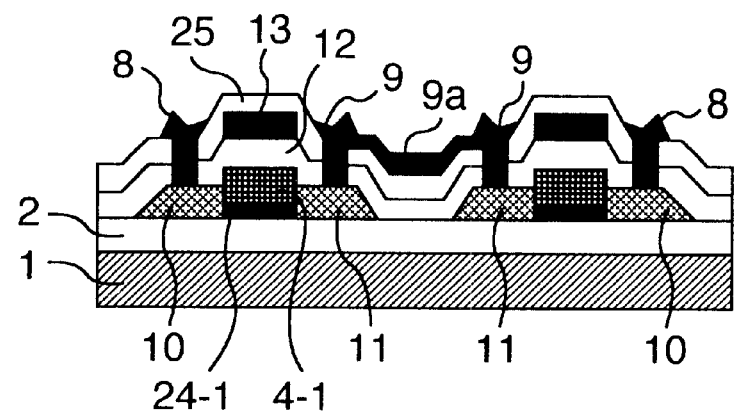
Figure 19C:
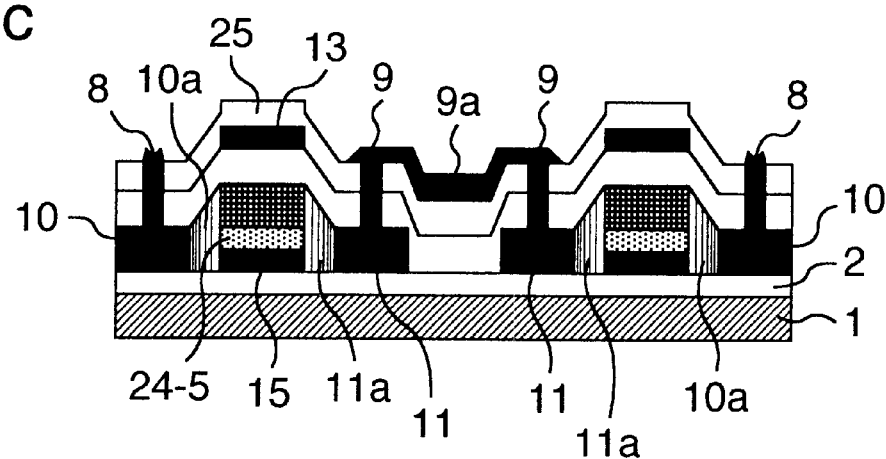

FIGS. 19a to 19c are cross-sectional views illustrating exemplary CMOS circuits according to another embodiment (seventh embodiment) of the present invention.

A CMOS circuit formed of a combination of a P-type transistor and an N-type transistor is used as a peripheral circuit for every semiconductor circuit. FIG. 19a illustrates a CMOS circuit using transistors manufactured according to the first embodiment; FIG. 19b illustrates a CMOS circuit using transistors manufactured according to the second embodiment; and FIG. 19c illustrates a CMOS circuit using transistors manufactured according to the sixth embodiment.

In either of the illustrated CMOS circuits, a P-type transistor and an N-type transistor have drain electrodes 9 interconnected through a wire 9a.

According to the seventh embodiment, high performance and small CMOS circuits can be provided.

Eighth Embodiment

Figure 20A:
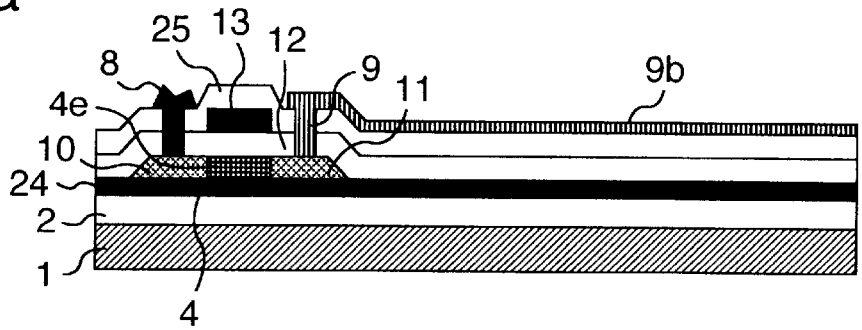
FIGS. 20a to 20c are cross-sectional views illustrating an exemplary pixel TFT according to another embodiment (eighth embodiment) of the present invention.
Figure 20B:
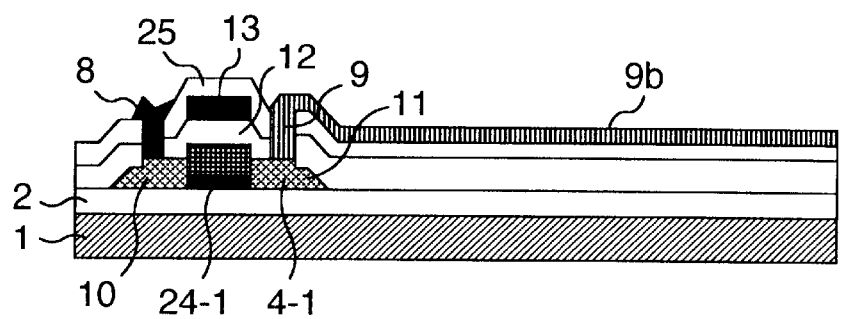
Figure 20C:
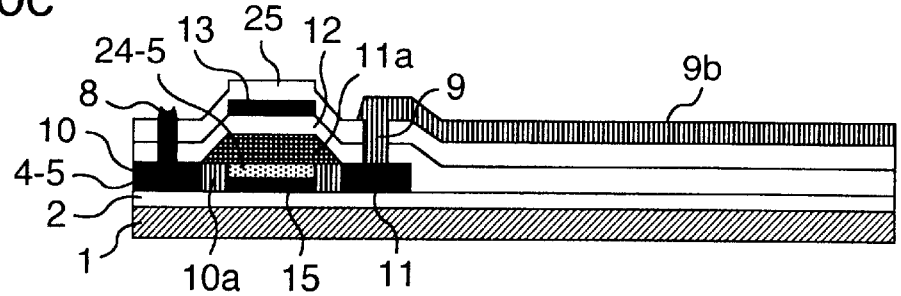

FIGS. 20a to 20c are cross-sectional views illustrating exemplary pixel TFTs according to another embodiment (eighth embodiment) of the present invention.

Specifically, FIG. 20a illustrates a pixel TFT formed of a transistor manufactured according to the first embodiment; FIG. 20b illustrates a pixel TFT formed of a transistor manufactured according to the second embodiment; and FIG. 20c illustrates a pixel TFT formed of a transistor manufactured according to the sixth embodiment. In the pixel TFT, since gate wires 9b and signal wires are arranged in a matrix and TFTs are disposed at their intersections, the gate wires 9b and the signal wires are made of a transparent material (for example, an ITO film).

According to the eighth embodiment, a high speed operation can be achieved, with the characteristics of pixel TFTs matching one another.

Ninth Embodiment

Figure 21:
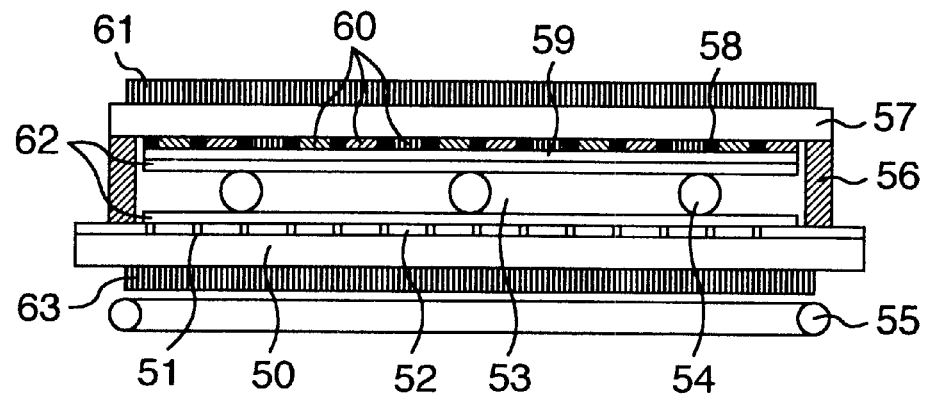
FIG. 21 is a cross-sectional view illustrating a liquid crystal panel according to another embodiment (ninth embodiment) of the present invention.

FIG. 21 is a cross-sectional view illustrating a liquid crystal panel according to another embodiment (ninth embodiment) of the present invention.

The liquid crystal panel comprises a glass substrate 50, and thin film transistors (TFT) 51 arranged in an array on the surface (upper surface) thereof. A polarizing plate 63 is attached on the other surface (lower surface) of the glass substrate 50. An alignment film 62 is overlapped on each TFT 51 on the glass substrate 50.

Also, over the glass substrate 50, a glass substrate 57 having a slightly smaller outside dimension than the glass substrate 50 is disposed in parallel. The glass substrate 57 is formed with RGB color filters 60, transparent electrodes 59 and alignment films 62 disposed on the lower surface thereof, and with a polarizing plate 61 on the upper surface thereof.

The glass substrate 50 and the glass substrate 57 are disposed in alignment with each other with intervention of a plurality of spacers 54 interposed between the alignment film 62 on the upper surface of the glass substrate 50 and the alignment film 62 on the lower surface of the glass substrate 57. Also, the glass substrate 50 and the glass substrate 57 are securely adhered with a sealing material 56 which surrounds the two alignment films 62, the spacers 54, the transparent electrodes 59 and a black matrix 58. Further, a back light 55 is disposed below the polarizing plate 63.

The glass substrate 50 and the TFTs 51 formed over the entire surface of the glass substrate 50 can be implemented by the semiconductor devices manufactured according to the respective embodiments described above.

According to the ninth embodiment, a clear image can be displayed on the liquid crystal panel employing the TFTs configured according to any of the aforementioned embodiments, since the respective TFTs are fast in operation and exhibit substantially the same characteristics.

Tenth Embodiment

Figure 22:
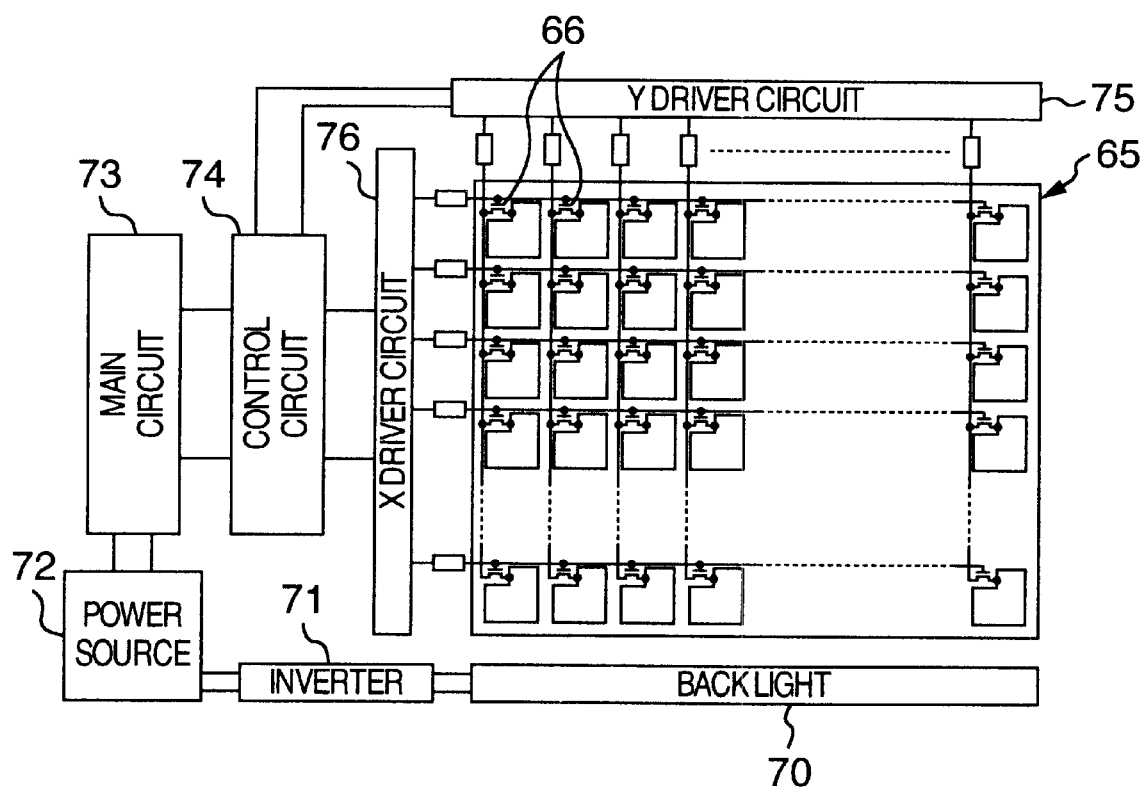
FIG. 22 is a block diagram illustrating the circuit configuration of a TFT driven LCD according to another embodiment (tenth embodiment) of the present invention.

FIG. 22 is a block diagram illustrating the configuration of a TFT panel (active matrix liquid crystal display panel) according to another embodiment (tenth embodiment) of the present invention.

A TFT driven LCD circuit as illustrated in FIG. 22 can be configured using any TFT CMOS circuit according to the seventh embodiment. Specifically, each pixel TFT 66 on a liquid crystal panel 65 is controlled by a X-driver circuit 75 and a Y-driver circuit 76 under the control of a control circuit 74. The control circuit 74 in turn is controlled by a main circuit 73. The main circuit 73 is powered from a power source 72. Also, a back light 70 of the liquid crystal panel 65 is powered by an invertor circuit 71 connected to the power source 72.

According to the tenth embodiment, since the control circuit 74, the X-driver circuit 75 and the Y-driver circuit 76 can be formed on the same glass substrate in the liquid crystal panel 65, it is possible to realize a reduced cost and a higher reliability for the liquid crystal panel.

Eleventh Embodiment

Figure 23:
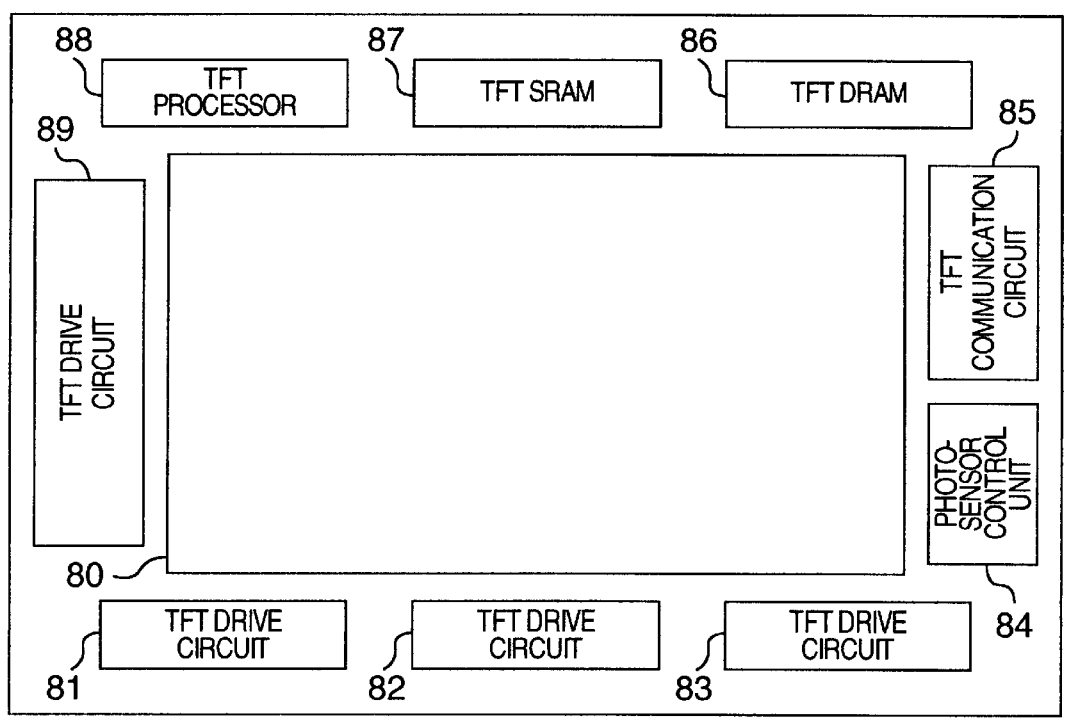
FIG. 23 is a layout diagram illustrating a system-on-panel according to another embodiment (eleventh embodiment) of the present invention.

FIG. 23 is a layout diagram illustrating a system-on-panel according to another embodiment (eleventh embodiment) of the present invention.

The system-on-panel illustrated in FIG. 23 can be configured by improving the ninth and tenth embodiments.

This system-on-panel comprises TFT driving circuits 81, 82, 83; a photosensor control unit 84; a TFT communication circuit 85; a TFT DRAM 86; a TFT SRAM 87; a TFT processor 88; and a TFT driving circuit 89, all of which are arranged around a rectangular display unit 80. These components are incorporated on a single glass substrate, and transistors included therein are implemented by any of the embodiments described above. Therefore, a fast, high performance and small system-on-panel is provided.

While the present invention made by the present inventors has been described based on various embodiments in a specific manner, it goes without saying that the present invention is not limited to the foregoing embodiments, and may be modified in various manners without departing from the spirit and scope of the invention as set forth in the appended claims.

What is claimed is:

1. A semiconductor device comprising:

an insulating base;

a first non-crystalline thin film formed on said insulating base;

a second non-crystalline thin film formed on at least a portion of a surface of said first thin film;

a polycrystalline semiconductor thin film formed on a surface of said second thin film or on the surfaces of said second thin film and said first thin film;

a field effect transistor having a channel formed of a portion of said polycrystalline semiconductor thin film, wherein said second thin film has a thermal conductivity higher than a thermal conductivity of said first thin film and lower than a thermal conductivity of said polycrystalline semiconductor thin film;

wherein said second thin film is disposed on at least a portion of a region of said first thin film corresponding to said channel in a predetermined pattern;

a light shielding film disposed between said first thin film and said second thin film in substantially the same pattern as said predetermined pattern of said second thin film; and a source region and a drain region of said field effect transistor disposed in said polycrystalline semiconductor thin film in self alignment with said light shielding film.

2. A semiconductor device according to claim 1, wherein said source region and said drain region have a lower impurity concentration in portions near said light shielding film than in portions away from said light shielding film.

3. A semiconductor device according to claim 2, wherein said second thin film includes end portions near said source region and said drain region of said field effect transistor, said end portions being gradually reduced in thickness toward said source region and said drain region, respectively.

4. A semiconductor device comprising:

an insulating base;

a first non-crystalline thin film formed on said insulating base;

a second non-crystalline thin film formed on at least a portion of a surface of said first thin film;

a polycrystalline semiconductor thin film formed on a surface of said second thin film or on the surfaces of said second thin film and said first thin film;

a field effect transistor having a channel formed of a portion of said polycrystalline semiconductor thin film, wherein said second thin film has a thermal conductivity higher than a thermal conductivity of said first thin film and lower than a thermal conductivity of said polycrystalline semiconductor thin film;

wherein said second thin film is disposed on at least a portion of a region of said first thin film corresponding to said channel in a predetermined pattern; and wherein said second thin film is formed in a double-sided comb-shaped pattern, and each digit extends in a lengthwise direction of said channel.

5. A semiconductor device comprising:

an insulating base;

a first thin film made of a silicon oxide film formed on said insulating base;

a second thin film made of a silicon nitride film formed on a portion of a surface of said first thin film;

a polycrystalline semiconductor thin film made of a silicon film or a silicon germanium film formed on surfaces of said second thin film and said first thin film; and a field effect transistor having a source, a drain and a channel formed in said polycrystalline semiconductor thin film, wherein said second thin film is formed only below said channel out of said source, said drain and said channel.

6. A semiconductor device according to claim 5, wherein said second thin film is formed in contact with said first thin film, and said polycrystalline semiconductor thin film is formed in contact with said second thin film.

* * * * *